(12) United States Patent
Lin

(10) Patent No.: US 6,593,224 B1
(45) Date of Patent: Jul. 15, 2003

(54) METHOD OF MANUFACTURING A MULTILAYER INTERCONNECT SUBSTRATE

(75) Inventor: Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 10/091,683

(22) Filed: Mar. 5, 2002

(51) Int. Cl.[7] .......................................... H01L 21/4763
(52) U.S. Cl. ........................ 438/618; 438/622; 438/666; 438/669
(58) Field of Search ................................. 438/618, 622, 438/666, 669

(56) References Cited

U.S. PATENT DOCUMENTS

| | | | |
|---|---|---|---|
| 5,011,580 A | 4/1991 | Pan et al. | 204/15 |
| 5,116,459 A | 5/1992 | Kordus et al. | 156/631 |
| 5,116,463 A | 5/1992 | Lin et al. | 156/653 |
| 5,118,385 A | 6/1992 | Kumar et al. | 156/644 |
| 5,137,845 A | 8/1992 | Lochon et al. | 437/183 |
| 5,183,972 A | 2/1993 | Duane et al. | 174/251 |
| 5,219,787 A | 6/1993 | Carey et al. | 437/187 |
| 5,236,551 A | 8/1993 | Pan | 156/643 |
| 5,254,493 A | 10/1993 | Kumar | 437/60 |
| 5,487,218 A | 1/1996 | Bhatt et al. | 29/852 |
| 5,613,296 A | 3/1997 | Kurino et al. | 29/852 |
| 5,646,067 A | 7/1997 | Gaul | 437/180 |
| 5,798,559 A * | 8/1998 | Bothra et al. | 257/522 |
| 5,822,856 A | 10/1998 | Bhatt et al. | 29/832 |
| 5,870,289 A | 2/1999 | Tokuda et al. | 361/779 |
| 6,159,770 A | 12/2000 | Tetaka et al. | 438/112 |
| 6,451,626 B1 * | 9/2002 | Lin | 438/108 |

OTHER PUBLICATIONS

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Terminal and Connection Joint".

U.S. application Ser. No. 09/864,773, filed May 24, 2001, entitled "Semiconductor Chip Assembly With Ball Bond Connection Joint".

U.S. application Ser. No. 09/878,649 filed Jun. 11, 2001, entitled "Method of Making a Semiconductor Chip Assembly with a Conductive Trace Subtractively Formed Before and After Chip Attachment".

(List continued on next page.)

Primary Examiner—T. N. Quach
(74) Attorney, Agent, or Firm—David M. Sigmond

(57) ABSTRACT

A method of manufacturing a multilayer interconnect substrate includes providing a first interconnect layer that includes a first conductive trace, wherein the first conductive trace includes a first pillar and a first routing line, and the first pillar protrudes vertically from and is electrically connected to the first routing line, providing a second interconnect layer that includes a second conductive trace, wherein the second conductive trace includes a second pillar and a second routing line, and the second pillar protrudes vertically from and is electrically connected to the second routing line, forming an opening in a dielectric layer between the first and second interconnect layers that exposes portions of the first pillar and the second routing line that were previously covered by the dielectric layer, and forming a connection joint in the opening that contacts and electrically connects the first pillar and the second routing line.

100 Claims, 17 Drawing Sheets

OTHER PUBLICATIONS

U.S. application Ser. No. 09/878,626 filed Jun. 11, 2001, entitled "Method of Connecting a Conductive Trace to a Semiconductor Chip".

U.S. application Ser. No. 09/878,521 filed Jun. 11, 2001, entitled "Method of Making a Support Circuit for a Semiconductor Chip Assembly".

U.S. application Ser. No. 09/878,522 filed Jun. 11, 2001, entitled "Method of Making a Semiconductor Chip Assembly".

U.S. application Ser. No. 09/927,216 filed Aug. 10, 2001, entitled "Semiconductor Chip Assembly with Hardened Connection Joint".

U.S. application Ser. No. 09/962,754 filed Sep. 24, 2001, entitled "Method of Connecting a Conductive Trace and an Insulative Base to a Semiconductor Chip".

U.S. application Ser. No. 09/972,796 filed Oct. 6, 2001, entitled "Method of Connecting a Bumped Compliant Conductive Trace and an Insulative Base to a Semiconductor Chip".

U.S. application Ser. No. 09/997,973 filed Nov. 29, 2001, entitled "Method of Connecting a Bumped Conductive Trace to a Semiconductor Chip".

* cited by examiner

METHOD OF MANUFACTURING A MULTILAYER INTERCONNECT SUBSTRATE

BACKGROUND OF THE INVENTION

1. Field of the Invention

The present invention relates generally to electrical substrates, and more particularly to multilayer interconnect substrates.

2. Description of the Related Art

Semiconductor chips are continuing to evolve at a phenomenal rate. However, semiconductor chips must be able to communicate with one another economically and reliably to obtain the benefits of these advances. As a result, semiconductor chips have dramatically changed the role of interconnect substrates (also called printed circuit boards and printed wiring boards). The substrate must not only provide signal routing, but also provide circuit signal matching, thermal management, mechanical support, and electrical functionality. For instance, as semiconductor chips contain more customized circuits, semiconductor chip packages contain higher input/output (I/O) counts and reduced contact pitch, and the higher I/O demands require high density interconnect substrates to support the wiring needs of closely spaced devices.

Interconnect substrates have generally kept pace with these demands by using plated through-holes and multilayering to increase circuit density. Plated through-holes connect circuitry on opposite sides of the substrate by means of holes that are drilled through the substrate and then plated with metal to provide conductivity. Multilayering allows separate circuit layers to be laminated together and then connected to each other by plated through-holes. However, these technologies are over 30 years old and have reached their limitations.

Plated through-holes have reached a practical limit of about 8 mils diameter, below which they become prohibitively expensive. In addition, plated through-holes are inefficient because they extend through the entire substrate while usually connecting only two circuit layers. This interferes with routing, and as layer counts increase the situation gets worse. Blind and buried vias have been developed to partially overcome these problems. A blind via is made by drilling partially through a multilayer so that the outer circuit layer can be connected to an inner circuit layer without disturbing the circuit layers below the inner circuit layer. A buried via is made by drilling and plating a two-sided circuit layer and then laminating it into a multilayer so that only two circuit layers that need to be connected have a plated hole and the remaining circuit layers are undisturbed. While blind and buried vias are helpful, they require more process steps and have the limitation of a mechanically drilled hole. As a result, blind and buried vias are interim solutions that do not adequately provide high I/O density surface mounting or facilitate optimum layer-to-layer wiring.

Multilayered substrates have grown from two layers to 40 layers and more. While theoretically it should be possible to increase the layer count without yield penalty, in practice yields fall rapidly as the layer count gets too high.

In view of the various development stages and limitations in currently available multilayer interconnect substrates, there is a need for a multilayer interconnect substrate that is cost-effective, reliable, manufacturable, provides excellent mechanical and electrical performance and has high density circuitry.

SUMMARY OF THE INVENTION

An object of the present invention is to provide a convenient, cost-effective method for manufacturing a high density multilayer interconnect substrate.

In accordance with one aspect of the invention, a method of manufacturing a multilayer interconnect substrate includes providing a first interconnect layer that includes a first conductive trace, wherein the first conductive trace includes a first pillar and a first routing line, and the first pillar protrudes vertically from and is electrically connected to the first routing line, providing a second interconnect layer that includes a second conductive trace, wherein the second conductive trace includes a second pillar and a second routing line, and the second pillar protrudes vertically from and is electrically connected to the second routing line, forming an opening in a dielectric layer between the first and second interconnect layers that exposes portions of the first pillar and the second routing line that were previously covered by the dielectric layer, and forming a connection joint in the opening that contacts and electrically connects the first pillar and the second routing line.

Preferably, the first routing line is planar and provides horizontal routing for the first pillar, the second routing line is planar and provides horizontal routing for the second pillar, the first pillar overlaps the second routing line, and the first pillar does not overlap the second pillar. It is also preferred that the opening exposes a distal portion of the first pillar and a sidewall portion of the second routing line but does not expose the first routing line or the second pillar. It is also preferred that the opening is formed by applying a plasma through a metal mask to the dielectric layer.

The connection joint can be formed by electroplating, electroless plating, ball bonding, solder reflowing or conductive adhesive curing.

In a first embodiment, the first pillar and the first routing line are electroplated to one another, and the second pillar and the second routing line are electroplated to one another. This is accomplished by providing a first metal layer with first and second opposing surfaces, electroplating the first routing line on the first surface of the first metal layer, electroplating a first etch mask on the second surface of the first metal layer, etching the first metal layer thereby forming the first pillar from an unetched portion of the first metal layer that contacts the first etch mask and the first routing line and exposing a portion of the first routing line that was previously covered by the first metal layer, removing the first etch mask, providing a second metal layer with first and second opposing surfaces, electroplating the second routing line on the first surface of the second metal layer, electroplating a second etch mask on the second surface of the second metal layer, disposing the dielectric layer between the first pillar and the second routing line thereby mechanically attaching the first pillar and the second routing line, etching the second metal layer thereby forming the second pillar from an unetched portion of the second metal layer that contacts the second etch mask and the second routing line and exposing a portion of the second routing line that was previously covered by the second metal layer, removing the second etch mask, forming the opening to expose the first pillar and the second routing line and then forming the connection joint on the first pillar and the second routing line.

In a second embodiment, the first pillar and the first routing line are integral with one another, and the second pillar and the second routing line are integral with one another. This is accomplished by providing a first metal layer with first and second opposing surfaces, forming a first recess in the first surface of the first metal layer, electroplating the first routing line on the first surface of the first metal layer and the first pillar in the first recess of the first metal layer, etching the first metal layer thereby exposing portions of the first pillar and the first routing line that were previously covered by the first metal layer, providing a second metal layer with first and second opposing surfaces, forming a second recess in the first surface of the second metal layer, electroplating the second routing line on the first surface of the second metal layer and the second pillar in the second recess of the second metal layer, disposing the dielectric layer between the first pillar and the second routing line thereby mechanically attaching the first pillar and the second routing line, etching the second metal layer thereby exposing portions of the second pillar and the second routing line that were previously covered by the second metal layer, forming the opening to expose the first pillar and the second routing line and then forming the connection joint on the first pillar and the second routing line.

An advantage of the present invention is that the interconnect substrate can contain high density circuitry with short signal lengths. This allows for improved circuit performance, particularly at high speeds and frequencies. Another advantage is that the interconnect substrate can be manufactured using low temperature processes which reduces stress and improves reliability. A further advantage is that the interconnect substrate can be manufactured using well-controlled wet chemical processes which can be easily implemented by circuit board, lead frame and tape manufacturers. Still another advantage is that the interconnect substrate can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1–20 are cross-sectional views of a method of manufacturing a multilayer interconnect substrate in accordance with a first embodiment of the present invention.

Figure 1:
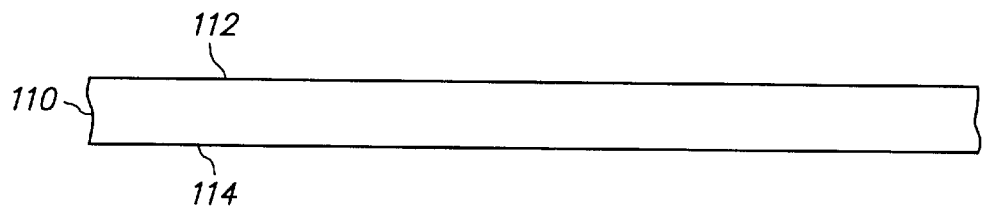
FIGS. 1–20 are cross-sectional views showing a method of manufacturing a multilayer interconnect substrate in accordance with a first embodiment of the present invention.

FIG. 1 is a cross-sectional view of metal layer 110 which includes opposing major surfaces 112 and 114. Metal layer 110 is a copper plate with a thickness of 127 microns.

Figure 2:
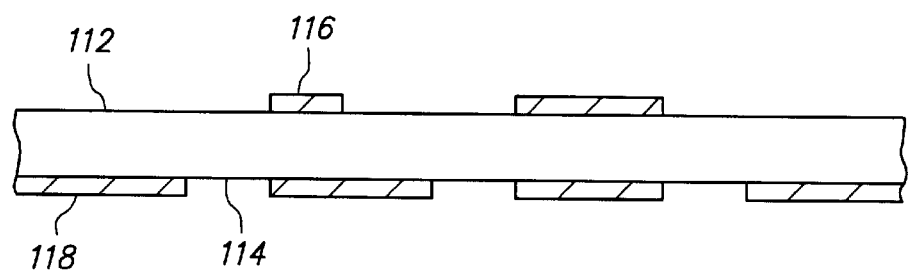

FIG. 2 is a cross-sectional view of photoresist layers 116 and 118 formed on metal layer 110. Photoresist layer 116 is deposited on surface 112, and photoresist layer 118 is deposited on surface 114 using a dry film lamination process in which hot rolls simultaneously press photoresist layers 116 and 118 onto surfaces 112 and 114, respectively. Photoresist layers 116 and 118 each have a thickness of 15 microns. Thereafter, photoresist layer 116 is patterned to selectively expose portions of surface 112, and photoresist layer 118 is patterned to selectively expose portions of surface 118. Photoresist layers 116 and 118 are simultaneously patterned by selectively applying light through associated reticles (not shown), applying a developer solution to remove the photoresist portions rendered soluble by the light, and then hard baking, as is conventional. As a result, photoresist layer 116 contains openings that selectively expose portions of surface 112, and photoresist layer 118 contains openings that selectively expose portions of surface 114.

Figure 3:
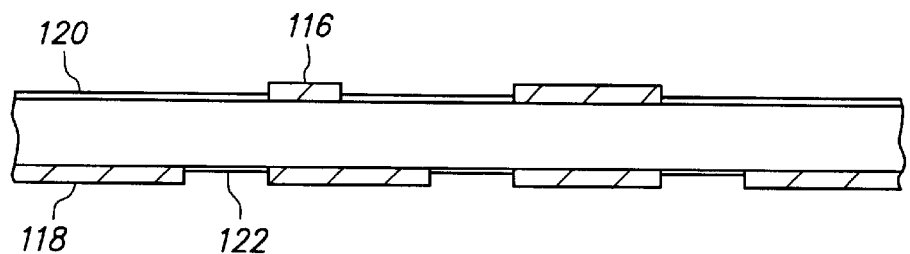

FIG. 3 is a cross-sectional view of routing lines 120 and etch masks 122 formed on metal layer 110. Routing lines 120 are composed of gold and have a thickness of 5 microns, and etch masks 122 are composed of nickel and have a thickness of 2 microns.

Routing lines 120 are formed by an electroplating operation. Thus, routing lines 120 are formed additively. Initially, a plastic sheet (not shown) is disposed over photoresist layer 118 and taped to the edges of metal layer 110 to prevent solution from contacting the exposed portions of surface 114, a plating bus (not shown) is connected to metal layer 110, current is applied to the plating bus from an external power source, and metal layer 110 is submerged in an electrolytic gold plating bath such as Technic Orotemp at room temperature. As a result, routing lines 120 electroplate on the exposed portions of surface 112. The electroplating operation continues until routing lines 120 have the desired thickness. Thereafter, the structure is removed from the electrolytic bath and rinsed in distilled water to remove contaminants, and the plastic sheet is removed.

Etch masks 122 are also formed by an electroplating operation. Initially, a plastic sheet (not shown) is disposed over photoresist layer 116 and taped to the edges of metal layer 110 to prevent solution from contacting routing lines 120, a plating bus (not shown) is connected to metal layer 110, current is applied to the plating bus from an external power source, and metal layer 110 is submerged in an electrolytic nickel plating bath such as Technic Techni Nickel "S" at room temperature. As a result, etch masks 122 electroplate on the exposed portions of surface 114. The electroplating operation continues until etch masks 122 have the desired thickness. Thereafter, the structure is removed from the electrolytic bath and rinsed in distilled water to remove contaminants, and the plastic sheet is removed.

Figure 4:
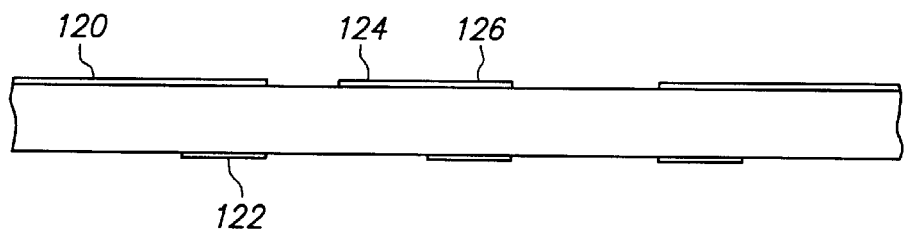
Figure 4A:
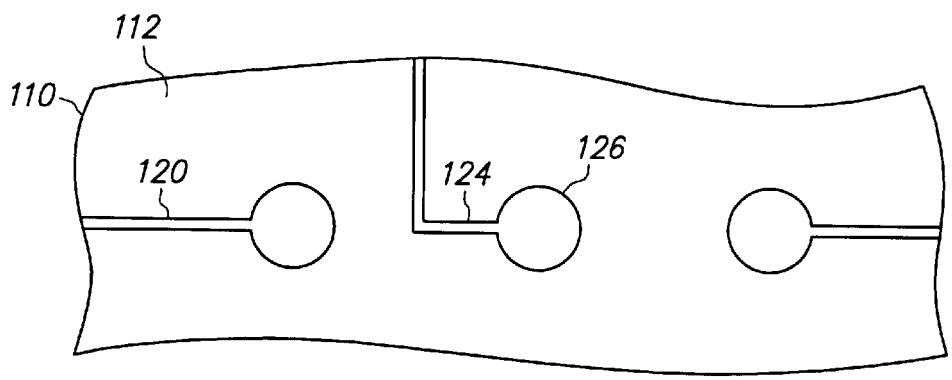
FIGS. 4A and 4B are top and bottom views, respectively, of FIG. 4.
Figure 4B:
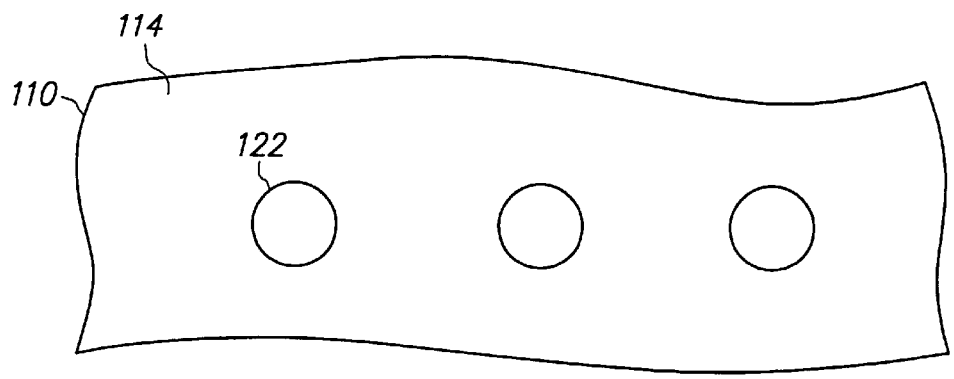

FIGS. 4, 4A and 4B are cross-sectional, top and bottom views, respectively, of metal layer 110, routing lines 120 and etch masks 122 after photoresist layers 116 and 118 are stripped. Routing lines 120 include elongated routing portions 124 with a width of 35 microns and enlarged circular portions 126 with a diameter of 300 microns, and etch masks 122 have circular shapes with a diameter of 300 microns. Furthermore, etch masks 122 are vertically aligned with enlarged circular portions 126.

Figure 5:
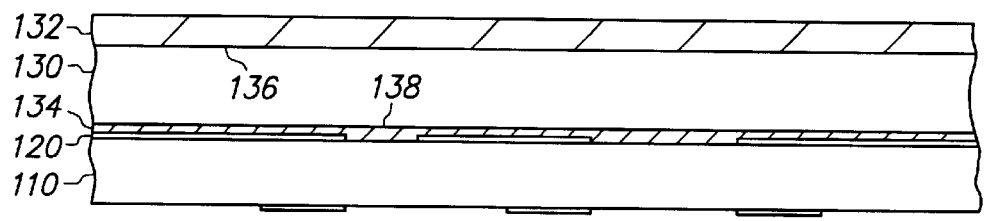

FIG. 5 is a cross-sectional view of metal layer 130 and etch mask 132 attached to metal layer 110 by adhesive 134.

Metal layer 130 is a copper plate with opposing major surfaces 136 and 138 and a thickness of 127 microns. Etch mask 132 is a resist ink such as PR-999 by Chung Yu Industry Corporation with a thickness of 50 microns. Adhesive 134 is an epoxy such as XS8448-1 by Namics Corporation with a thickness (between routing lines 120 and metal layer 130) of 10 microns.

Initially, etch mask 132 is deposited as liquid resin on surface 136 of metal layer 130 by stencil printing and then cured at 120° C. for 10–15 minutes to form a solid adherent layer. Thereafter, adhesive 134 is deposited as a liquid resin on surface 138 of metal layer 130 by stencil printing. Thereafter, metal layers 110 and 130 are aligned with one another, and adhesive 134 is sandwiched between metal layers 110 and 130 using relatively low pressure so that adhesive 134 contacts the exposed portions of surface 112 of metal layer 110 and routing lines 120 and continues to contact surface 138 of metal layer 130. Thereafter, adhesive 134 is cured at 150° C. for 30 minutes to form a solid electrically insulative adhesive layer that mechanically fastens metal layers 110 and 130.

Figure 6:
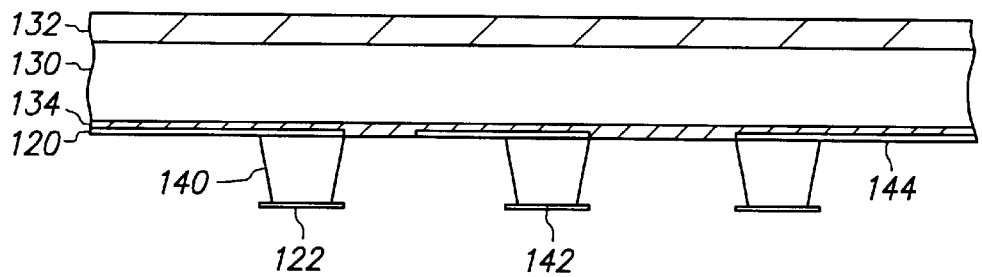

FIG. 6 is a cross-sectional view of pillars 140 formed in metal layer 110. Pillars 140 are formed by applying a wet chemical etch to the exposed portions of surface 114 using etch masks 122 to protect selected portions of surface 114 and using etch mask 132 to protect metal layer 130. Thus, pillars 140 are formed subtractively from unetched portions of metal layer 110. The wet chemical etch is highly selective of copper with respect to gold, nickel, resist ink and epoxy, and therefore no appreciable amount of routing lines 120, etch masks 122, etch mask 132 or adhesive 134 is removed. The wet chemical etch etches completely through metal layer 110 and exposes routing lines 120 and adhesive 134. Furthermore, the wet chemical etch undercuts (laterally etches) metal layer 110 beneath etch masks 122 so that pillars 140 taper inwardly with increasing vertical distance from routing lines 120. A suitable taper is between 45 and slightly less than 90 degrees, such as approximately 75 degrees. Pillars 140 have conical shapes with a diameter of 200 microns at distal ends 142 that contact etch masks 122 and face away from routing lines 120, and a diameter of 300 microns at the opposite ends that contact enlarged circular portions 126 of routing lines 120 and face away from etch masks 122. Pillars 140 have flat surfaces at distal ends 142, at what remains of surface 114.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing metal layer 110 to the wet chemical etch in order to form pillars 140 with the desired dimensions can be established through trial and error.

The combination of routing lines 120 and pillars 140 form conductive traces 144. Each conductive trace 144 includes a single routing line 120 and a single pillar 140 that are electroplated to one another. Routing lines 120 provide horizontal routing and pillars 140 provide vertical routing. At this stage, routing lines 120 are embedded in and coplanar with adhesive 134 at an exposed surface that was previously covered by metal layer 110, and metal base 130 is a support carrier that provides mechanical support for conductive traces 144.

Figure 7:
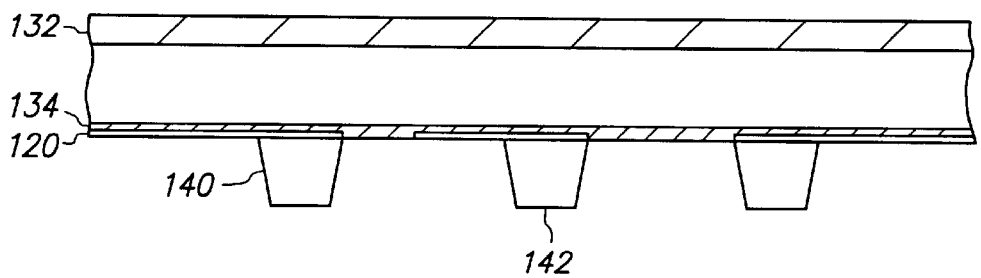

FIG. 7 is a cross-sectional view of the structure after etch masks 122 are removed using a nickel etching solution that is highly selective of nickel with respect to gold, resist ink and epoxy. A suitable nickel etching solution is a dilute mixture of nitric and hydrochloric acid. Since etch masks 122 (composed of nickel) are extremely thin relative to pillars 140 (composed of copper), and the structure is removed from the nickel etching solution immediately after etch masks 122 are stripped, it is not critical that the nickel etching solution be highly selective of nickel with respect to copper, and the nickel etching solution has no significant impact on pillars 140. Therefore, no appreciable amount of routing lines 120, etch mask 132, adhesive 134 or pillars 140 is removed. Stripping etch masks 122 exposes distal ends 142 of pillars 140.

Figure 8:
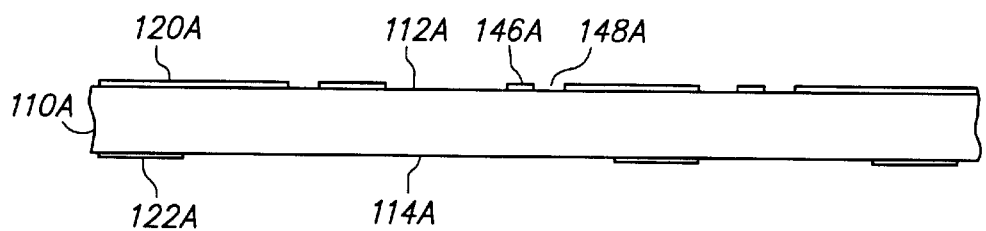
Figure 8A:
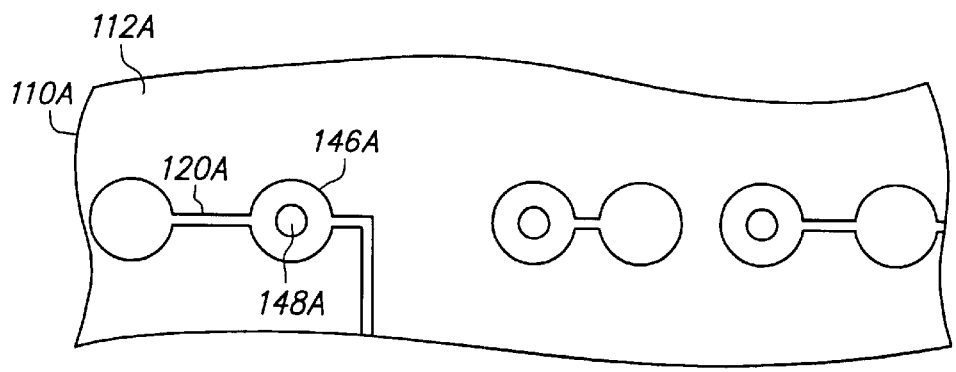
FIGS. 8A and 8B are top and bottom views, respectively, of FIG. 8.
Figure 8B:
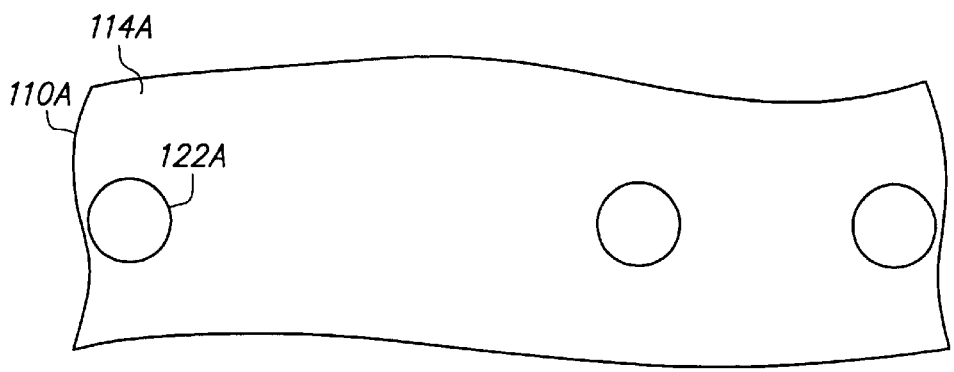

FIGS. 8, 8A and 8B are cross-sectional, top and bottom views, respectively, of metal layer 110A, routing lines 120A and etch masks 122A. Metal layer 110A includes opposing major surfaces 112A and 114A, routing lines 120A are electroplated on surface 112A, and etch masks 122A are electroplated on surface 114A. Metal layer 110A, routing lines 120A and etch masks 122A are manufactured in the same manner as metal layer 110, routing lines 120 and etch masks 122, respectively. However, routing lines 120A include enlarged circular portions 146A and through-holes 148A within the enlarged circular portions 146A. Through-holes 148A have diameters of 150 microns.

Figure 9:
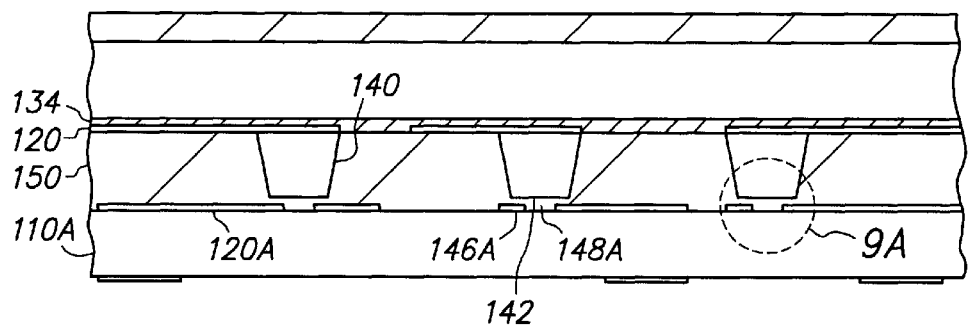

FIG. 9 is a cross-sectional view of routing lines 120A and pillars 140 attached together by dielectric layer 150. Dielectric layer 150 is a benzocyclobutene (BCB) layer with a thickness (between routing lines 120A and pillars 140) of 10 microns.

BCB is a thermosetting resin commercialized by Dow Chemical Company under the tradename Cyclotene™. BCB is used in multichip thin film packaging applications and exhibits relatively strong adhesion to metal and a low dielectric constant. A suitable BCB is Cyclotene 3022-63.

Initially, dielectric layer 150 is dispensed on routing lines 120, adhesive 134 and pillars 140 as a viscous liquid resin. The liquid resin forms a relatively flat layer that extends 50 microns beyond pillars 140 in the direction away from routing lines 120.

Thereafter, the interconnect layers are positioned so that routing lines 120A are aligned with pillars 140, and dielectric layer 150 is sandwiched between routing lines 120A and pillars 140 using relatively low pressure so that dielectric layer 150 contacts the exposed portions of surface 112A of metal layer 110A and routing lines 120A, fills through-holes 148A and continues to contact routing lines 120, adhesive 134 and pillars 140. The pressure places routing lines 120A and pillars 140 in close proximity to one another, but a small amount of dielectric layer 150 remains between routing lines 120A and pillars 140 after the interconnect layers stop moving towards one another. Although the pressure is high enough squeeze out most of dielectric layer 150 between routing lines 120A and pillars 140, the pressure is not high enough to squeeze out all of dielectric layer 150 between routing lines 120A and pillars 140 since doing so might cause pillars 140 to damage or distort routing lines 120A.

Thereafter, dielectric layer 150 is cured at 250° C. for 1 hour to form a solid electrically insulative adhesive layer that mechanically fastens routing lines 120A and pillars 140.

Routing lines 120A overlap pillars 140 in one-to-one relation. Thus, each enlarged circular portion 146A is axially aligned with and overlaps an associated pillar 140, and each through-hole 148A is axially aligned with and concentrically centered within a distal end 142 of an associated pillar 140. In addition, routing lines 120A and pillars 140 do not contact one another, and instead are separated by dielectric layer 150 and remain electrically isolated from one another.

Figure 9A:
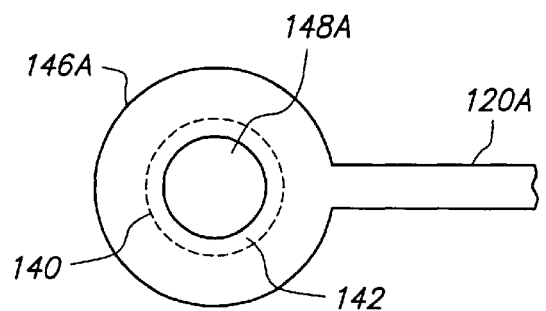
FIG. 9A is an enlarged plan view of encircled detail 9A in FIG. 9.

FIG. 9A is an enlarged plan view of encircled detail 9A in FIG. 9 that shows a representative routing line 120A and pillar 140 in greater detail. This view is observed from surface 112A of metal layer 110A, and therefore routing line 120A overlaps pillar 140, and pillar 140 is shown in phantom. As is seen, through-hole 148A of routing line 120A is axially aligned with and concentrically centered within distal end 142 of pillar 140.

Figure 10:
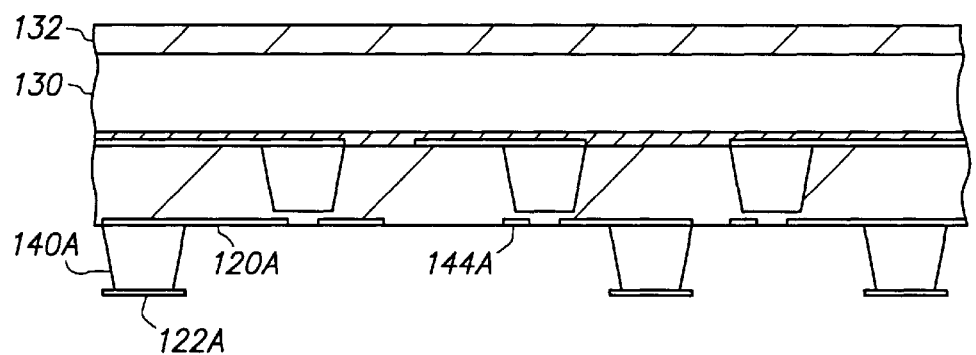

FIG. 10 is a cross-sectional view of pillars 140A formed in metal layer 110A. Pillars 140A are formed by applying a wet chemical etch to the exposed portions of surface 114A using etch masks 122A to protect selected portions of surface 114A and using etch mask 132 to protect metal layer 130. Thus, pillars 140A are formed in the same manner as pillars 140. The combination of routing lines 120A and pillars 140A form conductive traces 144A. Routing lines 120A provide horizontal routing and pillars 140A provide vertical routing. Furthermore, pillars 140 and 140A do not overlap one another.

Figure 11:
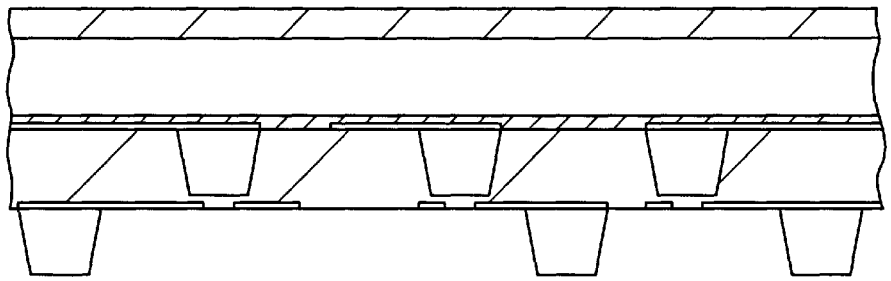

FIG. 11 is a cross-sectional view of the structure after etch masks 122A are removed in the same manner that etch masks 122 were removed.

Figure 12:
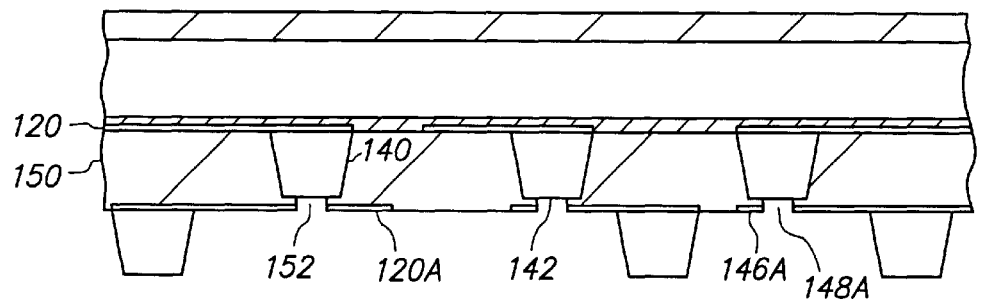

FIG. 12 is a cross-sectional view of the structure after openings 152 are formed in dielectric layer 150 that expose through-holes 148A of routing lines 120A and distal ends 142 of pillars 140. In particular, a metal mask (not shown) is positioned proximate to distal ends 142A of pillars 140A such that openings in the metal mask are aligned with through-holes 148A, and a plasma (reactive ion etch) is directed to the side of the metal mask opposite the structure. A suitable plasma is a fluorinated plasma such as $CF_4/O_2$ or $SF_6/O_2$. The metal mask targets the plasma at through-holes 148A, and the plasma removes portions of dielectric layer 150 that reside inside or directly beneath through-holes 148A. The plasma also strikes enlarged circular portions 146A outside through-holes 148A. Thus, distal ends 142 of pillars 140 and enlarged circular portions 146A of routing lines 120A provide an etch stop for the plasma. However, the plasma does not deform or remove an appreciable amount of routing lines 120A or pillars 140. In addition, enlarged circular portions 146A are large enough to prevent the plasma from striking dielectric layer 150 outside through-holes 148A despite minor registration and alignment inaccuracies. As a result, dielectric layer 150 is selectively etched using a plasma to provide an extension or pattern transfer of through-holes 148A through dielectric layer 150 to distal ends 142 of pillars 140.

Openings 152 expose routing lines 120A at the inner sidewalls of through-holes 148A and expose pillars 140 at distal ends 142. Thus, openings 152 expose portions of routing lines 120A and pillars 140 that were previously covered by dielectric layer 150. However, openings 152 do not expose routing lines 120 or the sidewalls of pillars 140. Openings 152 have a diameter of 150 microns and extend to and are axially aligned with and concentrically centered within distal ends 142 of pillars 140. Routing lines 120A shield the underlying dielectric layer 150 from the plasma etch so that portions of dielectric layer 150 sandwiched between routing lines 120A and pillars 140 remain intact.

Figure 13:
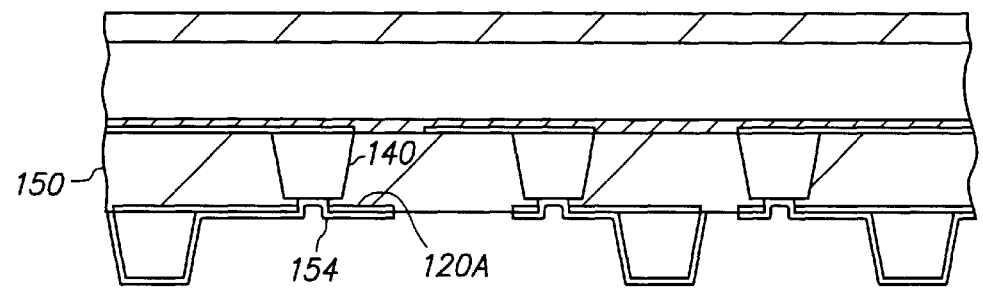

FIG. 13 is a cross-sectional view of the structure after connection joints 154 are formed on routing lines 120A and pillars 140, thereby electrically connecting routing lines 120A and pillars 140. Connection joints 154 are composed of nickel electrolessly plated onto routing lines 120A and pillars 140. Connection joints 154 are located in openings 152 and contact the inner sidewalls of through-holes 148A and distal ends 142 of pillars 140 that were previously exposed by openings 152.

Prior to the electroless plating, the assembly is dipped in an acid solution to clean the exposed copper. The acid solution can be inorganic, such as hydrochloric acid, sulfuric acid, phosphoric acid and combinations thereof, or organic, such as a carboxyl acid such as formic acid, acetic acid, propionic acid, citric acid and combinations thereof. The preferred acid is dilute hydrochloric acid. Thereafter, the assembly is rinsed in deionized water to remove the acid.

Thereafter, the structure is dipped in a copper activator solution such as dilute palladium chloride of approximately 0.1 grams of palladium chloride and 5 cubic centimeters of hydrochloric acid per liter of water for 10 seconds. A suitable copper activator solution is Shipley CATA-POSIT™. The palladium renders the exposed copper catalytic to electroless nickel. Accordingly, the palladium renders pillars 140 and 140A catalytic to electroless nickel. A small amount of the palladium might also become trapped in dielectric layer 150 and render dielectric layer 150 catalytic to electroless nickel. As a result, the structure is next dipped in a deactivator solution that renders the exposed dielectric surfaces non-catalytic without affecting the exposed copper surfaces. Suitable deactivator solutions include aqueous or non-aqueous acids such as hydrochloric acid, phosphoric acid, and a carboxyl acid such as formic acid, acetic acid, propionic acid, citric acid and combinations thereof. The deactivator acid can also be an alcohol-based, ketone-based or ether-based solution, as well as ethanol, methanol, propanol, acetone, or ethyl ether based. The preferred deactivator solution is dilute hydrochloric acid. Thereafter, the structure is rinsed in deionized water to remove the deactivator solution.

Thereafter, the assembly is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

The nickel is amorphous and does not deposit on dielectric layer 150 and therefore a mask is not necessary. Since gold is catalytic to electroless nickel, and the exposed copper surfaces have been rendered catalytic to electroless nickel, first portions of connection joints 154 begin to plate on pillars 140, and second portions of connection joints 154 begin to plate on routing lines 120A and pillars 140A. At this initial stage, the first and second portions of connection joints 154 do not contact one another. However, as the electroless plating continues, the first portions of connection joints 154 grow from distal ends 142 of pillars 140 towards through-holes 148A, and the second portions of connection joints 154 grow from the inner sidewalls of through-holes 148A towards distal ends 142 of pillars 140. Eventually, the first and second portions of connection joints 154 contact one another and metallurgically merge into unitary connection joints 154. The electroless plating continues until connection joints 154 have the desired thickness. Thereafter, the structure is removed from the electroless bath and rinsed in distilled water to remove contaminants.

Connection joints 154 are primarily nickel, contain about 4 to 9 weight percentage phosphorus, and have a thickness in the range of 10 to 50 microns. Connection joints 154 provide continuous electrically conductive metal paths inside openings 152 that contact routing lines 120A and pillars 140, thereby electrically connecting routing lines 120A and pillars 140. Thus, connection joints 154 provide robust, permanent electrical connections between routing lines 120A and pillars 140.

Connection joints 154 are the only electrical conductors in through-holes 148A or openings 152, and dielectric layer 150 and connection joints 154 are the only materials that contact both routing lines 120A and pillars 140.

Figure 14:
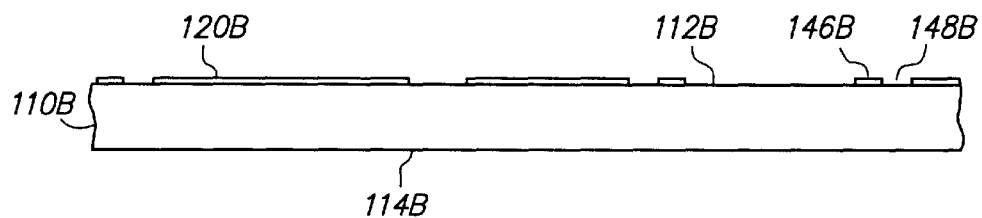

FIG. 14 is a cross-sectional view of metal layer 110B and routing lines 120B. Metal layer 110B includes opposing major surfaces 112B and 114B, and routing lines 120B are electroplated on surface 112B. Metal layer 110B and routing lines 120B are manufactured in the same manner as metal layer 110 and routing lines 120, respectively. However, routing lines 120B include enlarged circular portions 146B with a diameter of 300 microns and through-holes 148B within the enlarged circular portions 146B with a diameter of 150 microns. In addition, routing lines 120B exclude enlarged circular portions similar to enlarged circular portions 126 since pillars will not be formed from metal layer 110B.

Figure 15:
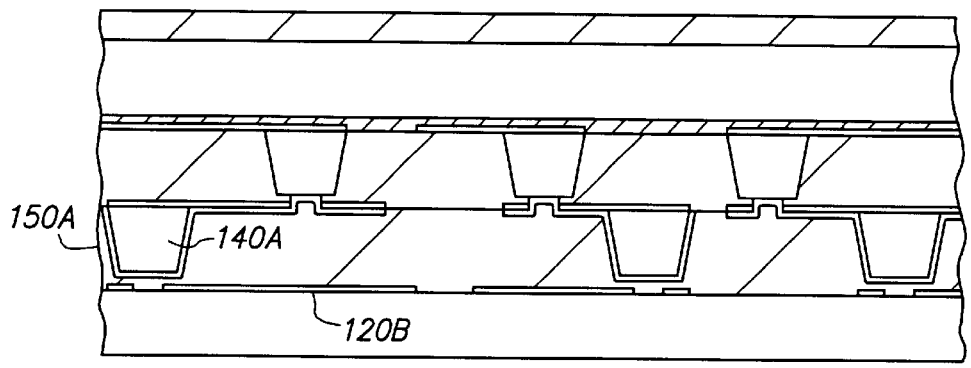

FIG. 15 is a cross-sectional view of routing lines 120B and pillars 140A attached together by dielectric layer 150A in the same manner that routing lines 120A and pillars 140 were attached together by dielectric layer 150. Thus, dielectric layer 150A is a BCB layer with a thickness (between routing lines 120B and pillars 140A) of 10 microns, routing lines 120B overlap pillars 140A in one-to-one relation, and enlarged circular portions 146B and through-holes 148B of routing lines 120B are axially aligned with and concentrically centered within and spaced from distal ends 142A of pillars 140A.

Figure 16:
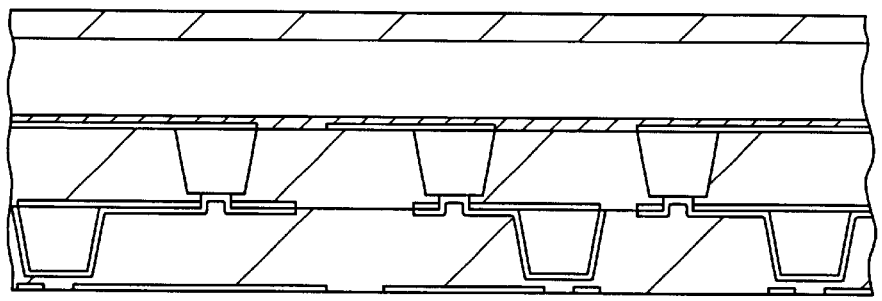

FIG. 16 is a cross-sectional view of the structure after metal layer 110B is removed. Metal layer 110B is removed by applying the same wet chemical etch that formed pillars 140 and 140A. However, since no etch mask exists on surface 114B, metal layer 110B is completely removed.

Figure 17:
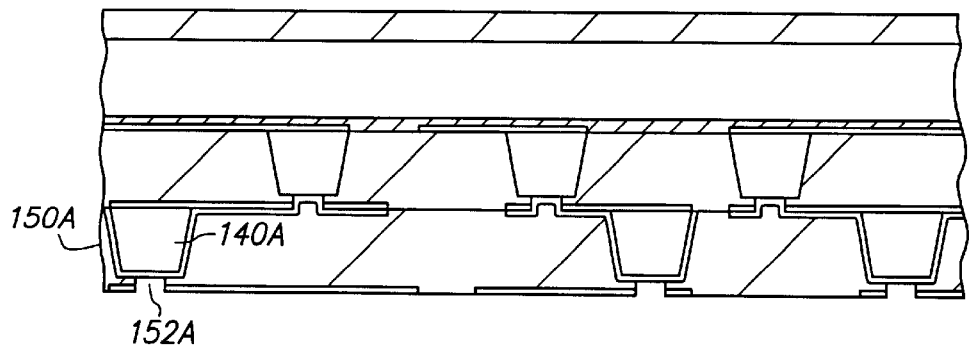

FIG. 17 is a cross-sectional view of the structure after openings 152A are formed in dielectric layer 150A that expose through-holes 148B and portions of connection joints 154 on distal ends 142A of pillars 140A. Openings 152A are formed in the same manner as openings 152.

Figure 18:
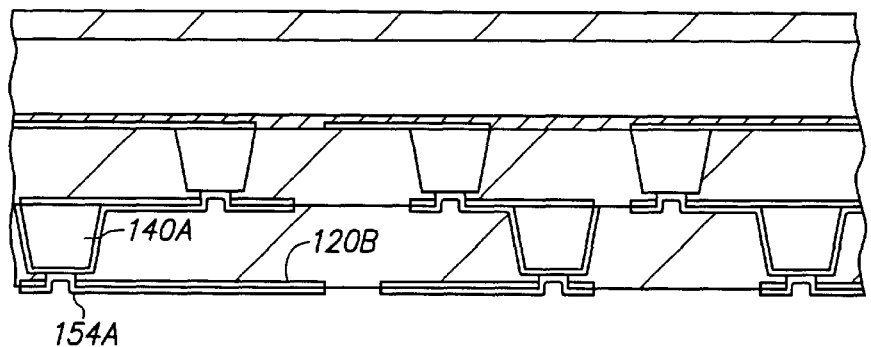

FIG. 18 is a cross-sectional view of the structure after connection joints 154A are formed on routing lines 120B and portions of connection joints 154 on pillars 140A, thereby electrically connecting routing lines 120B and pillars 140A. Connection joints 154A are formed in the same manner as connection joints 154, except that the copper activator solution and subsequent deactivator solution are unnecessary since connection joints 154 are composed of nickel.

Figure 19:
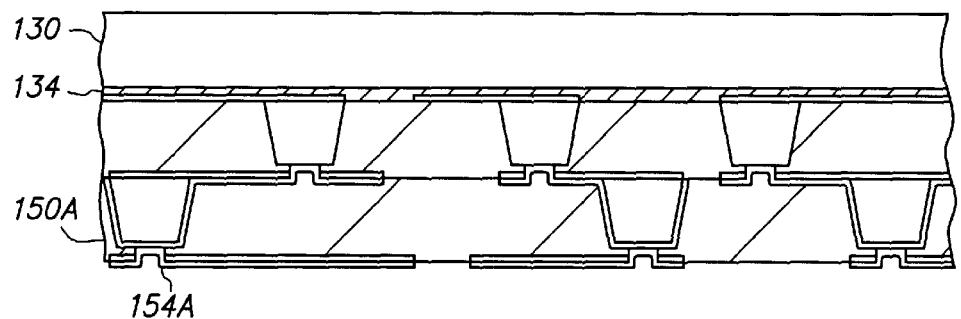

FIG. 19 is a cross-sectional view of the structure after etch mask 132 is removed using a 3–5% sodium hydroxide solution at room temperature for 5–10 seconds. The sodium hydroxide solution is highly selective of resist ink with respect to copper, nickel and BCB. Therefore, no appreciable amount of metal layer 130, dielectric layer 150A or connection joints 154A is removed.

Figure 20:
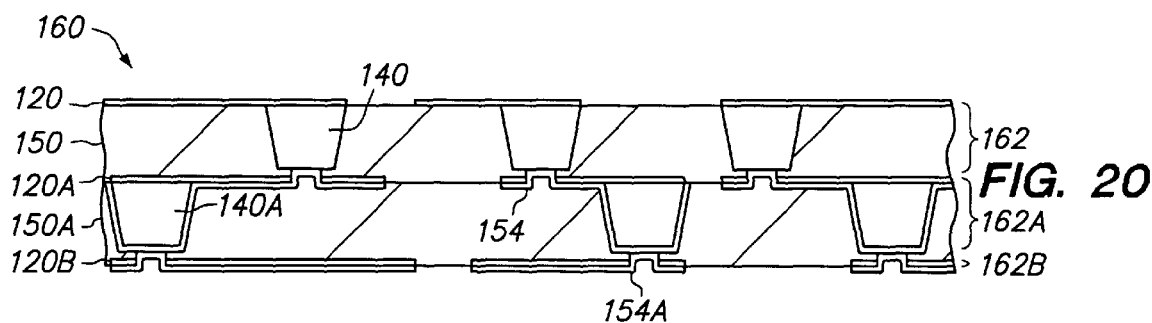

FIG. 20 is a cross-sectional view of the structure after metal layer 130 and adhesive 134 are removed. Metal layer 130 is removed in the same manner that metal layer 110B was removed. Thereafter, adhesive 134 is removed using a plasma that is highly selective of epoxy with respect to gold, copper and nickel. A suitable plasma is a fluorinated plasma such as $CF_4/O_2$. Since adhesive 134 (composed of epoxy) is extremely thin relative to dielectric layer 150 (composed of BCB), and the structure is removed from the plasma immediately after routing lines 120 are exposed, it is not critical that the plasma be highly selective of epoxy with respect to BCB. Therefore, no appreciable amount of routing lines 120, pillars 140, dielectric layer 150, dielectric layer 150A or connection joints 154A is removed. Furthermore, it is relatively unimportant whether the structure is slightly underetched and a small amount of adhesive 134 remains between routing lines 120, or the structure is slightly overetched and a small amount of dielectric layer 150 is removed between routing lines 120. Therefore, a wide range of plasma etch times can be used.

At this stage, the manufacture of multilayer interconnect substrate 160 that includes routing lines 120, 120A and 120B, pillars 140 and 140A, dielectric layers 150 and 150A and connection joints 154 and 154A can be considered complete. Routing lines 120 and pillars 140 provide a first interconnect layer 162, routing lines 120A and pillars 140A provide a second interconnect layer 162A, and routing lines 120B provide a third interconnect layer 162B. Multilayer interconnect substrate 160 includes other routing lines, pillars and connection joints, and only a few routing lines, pillars and connection joints are shown for convenience of illustration. The routing lines provide horizontal routing, and the pillars provide vertical routing.

Multilayer interconnect substrate 160 is adapted to receive and electrically connect various semiconductor chip packages such as ball grid arrays, thin small outline packages, and so on. The semiconductor chip packages can be mounted on routing lines 120. However, multilayer interconnect substrate 160 is a passive device that is devoid of active circuitry, and is not electrically connected to active circuitry until a semiconductor chip package is mounted thereon.

FIGS. 21–40 are cross-sectional views of a method of manufacturing a multilayer interconnect substrate in accordance with a second embodiment of the present invention. In the second embodiment, the pillars and routing lines in an interconnect layer are integral with one another, and the pillars include cavities. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, metal layer 210 corresponds to metal layer 110, routing lines 220 correspond to routing lines 120, etc.

Figure 21:
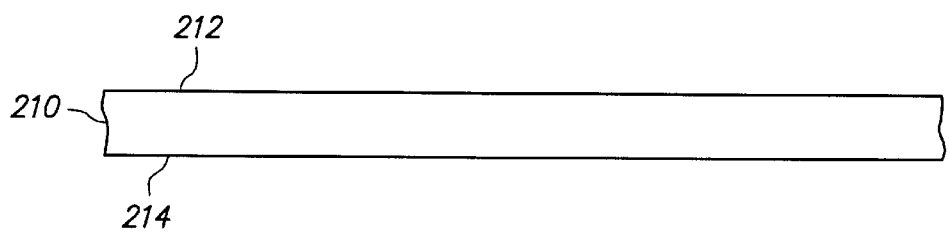
FIGS. 21–40 are cross-sectional views showing a method of manufacturing a multilayer interconnect substrate in accordance with a second embodiment of the present invention.

FIG. 21 is a cross-sectional view of metal layer 210 which includes opposing major surfaces 212 and 214. Metal layer 210 is a copper plate with a thickness of 127 microns.

Figure 22:
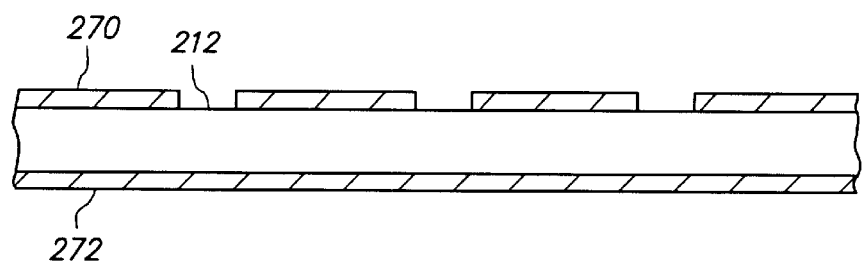

FIG. 22 is a cross-sectional view of photoresist layers 270 and 272 formed on metal layer 210. Photoresist layer 270 is deposited on surface 212, and photoresist layer 272 is deposited on surface 214 using a dry film lamination process in which hot rolls simultaneously press photoresist layers 270 and 272 onto surfaces 212 and 214, respectively. Photoresist layers 270 and 272 each have a thickness of 15 microns. Thereafter, photoresist layer 270 is patterned to selectively expose portions of surface 212, and photoresist layer 272 remains unpatterned. Photoresist layer 270 is patterned by selectively applying light through an associated reticle (not shown), applying a developer solution to remove the photoresist portions rendered soluble by the light, and then hard baking, as is conventional. As a result, photoresist layer 270 contains openings that selectively expose portions of surface 212, and photoresist layer 272 covers the entire surface 214.

Figure 23:
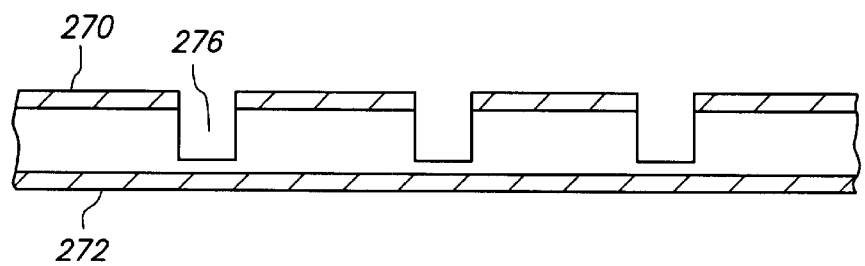

FIG. 23 is a cross-sectional view of recesses 276 formed in metal layer 210. Recesses 276 are formed by applying a wet chemical etch to exposed portions of surface 212 using photoresist layers 270 and 272 as etch masks. The wet chemical etch is applied using the same etchant that formed pillars 140.

The wet chemical etch does not etch completely through metal layer 210. Rather, the wet chemical etch etches partially through metal layer 210. The structure is submerged in the wet chemical etch long enough for the etchant to etch about 100 microns into metal layer 210. Thus recesses 276 have a depth of 100 microns beneath surface 212. The optimal etch time for exposing metal layer 210 to the wet chemical etch in order to form recesses 276 with the desired dimensions can be established through trial and error.

Figure 24:
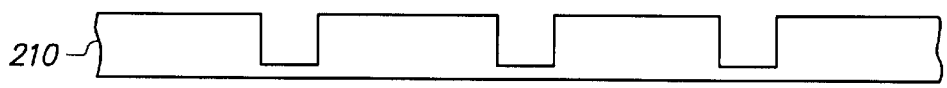

FIG. 24 is a cross-sectional view of metal layer 210 after photoresist layers 270 and 272 are is stripped.

Figure 25:
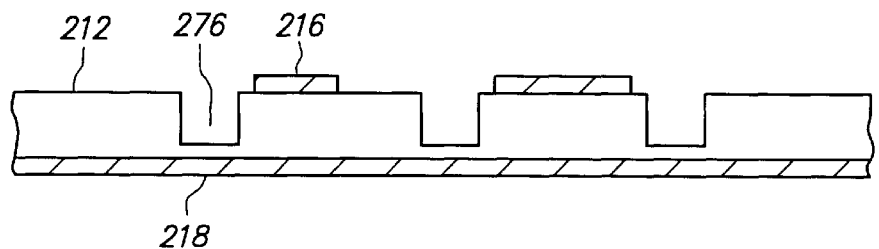

FIG. 25 is a cross-sectional view of photoresist layers 216 and 218 formed on metal layer 210. Photoresist layer 216 is deposited on surface 212, and photoresist layer 218 is deposited on surface 214. Thereafter, photoresist layer 216 is patterned to selectively expose portions of surface 212 as well as recesses 276, and photoresist layer 218 covers the entire surface 214.

Figure 26:
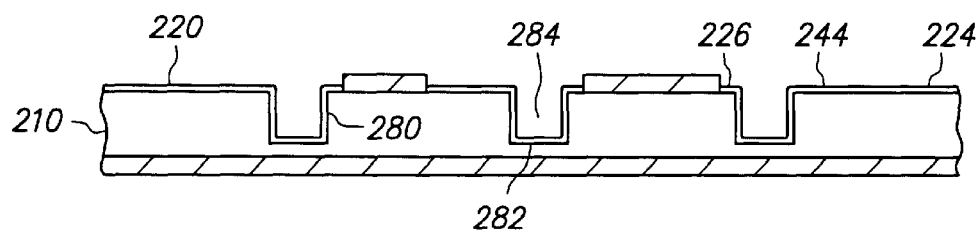

FIG. 26 is a cross-sectional view of routing lines 220 and pillars 280 formed on metal layer 210. Routing lines 220 and pillars 280 are composed of gold and have a thickness of 5 microns.

Routing lines 220 and pillars 280 are formed by an electroplating operation similar to that used to form routing lines 120. Thus, routing lines 220 and pillars 280 are formed additively as they are simultaneously electroplated on metal layer 210 and are integral with one another. Routing lines 220 are formed on the exposed portions of surface 212, and pillars 280 are formed in recesses 276.

Routing lines 220 include elongated routing portions 224 with a width of 35 microns and enlarged annular portions 226 with a diameter of 300 microns that surround and are contiguous with pillars 280. Pillars 280 have bump shapes with a height (relative to routing lines 220) of 100 microns and a diameter of 200 microns. Pillars 280 have flat surfaces at distal ends 282 that contact metal layer 210 and face away from routing lines 220, and cavities 284 that extend into recesses 276 and face away from metal layer 210. Pillars 280 also have tapered sidewalls that slant inwardly as the vertical distance from routing lines 220 increases. This follows the shape of recesses 276, which have tapered sidewalls due to the isotropic nature of the wet chemical etch. For convenience of illustration, the sidewalls are shown generally orthogonal to surface 212. The combination of routing lines 220 and pillars 280 form conductive traces 244.

Figure 27:
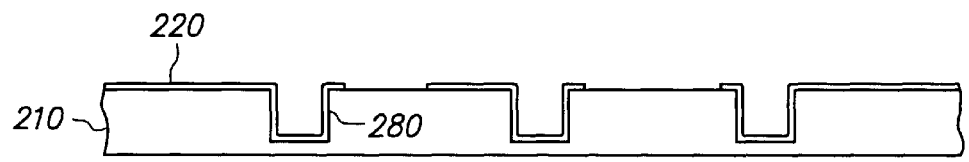

FIG. 27 is a cross-sectional view of metal layer 210, routing lines 220 and pillars 280 after photoresist layers 216 and 218 are stripped.

Figure 28:
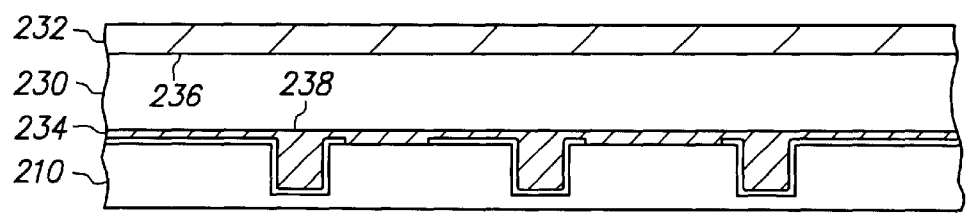

FIG. 28 is a cross-sectional view of metal layer 230 and etch mask 232 attached to metal layer 210 by adhesive 234. Metal layer 230 is a copper plate with opposing major surfaces 236 and 238 and a thickness of 127microns. Etch mask 232 is a resist ink layer with a thickness of 50 microns, and adhesive 234 is an epoxy layer with a thickness (between routing lines 220 and metal layer 230) of 10 microns. Adhesive 234 fills cavities 284.

Figure 29:
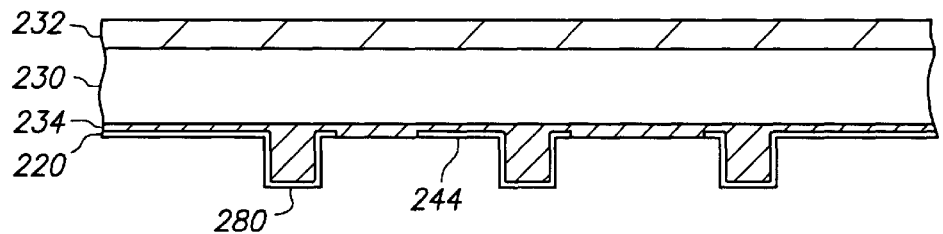
Figure 29A:
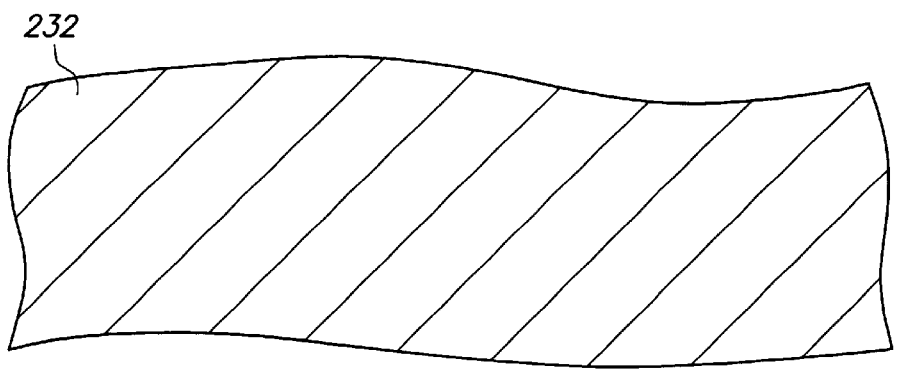
FIGS. 29A and 29B are top and bottom views, respectively, of FIG. 29.
Figure 29B:
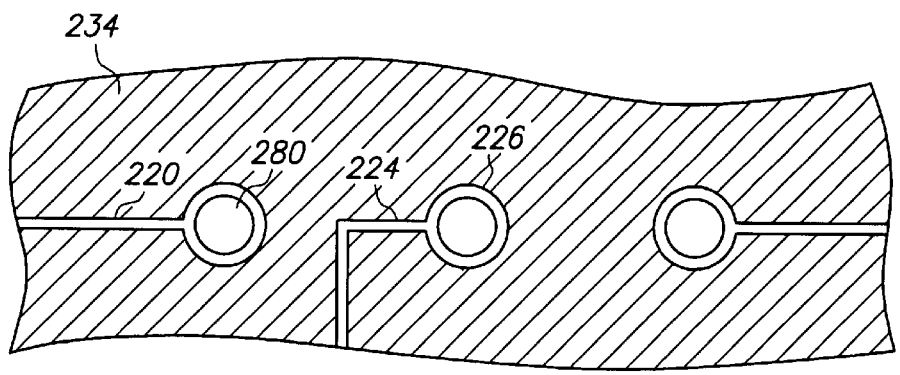

FIGS. 29, 29A and 29B are cross-sectional, top and bottom views, respectively, of the structure after metal layer 210 is removed. Metal layer 210 is removed in the same manner that metal layer 130 was removed.

At this stage, routing lines 220 are embedded in and coplanar with adhesive 234 at an exposed surface that was previously covered by metal layer 210, pillars 280 are exposed, and metal base 230 is a support carrier that provides mechanical support for conductive traces 244.

Figure 30:
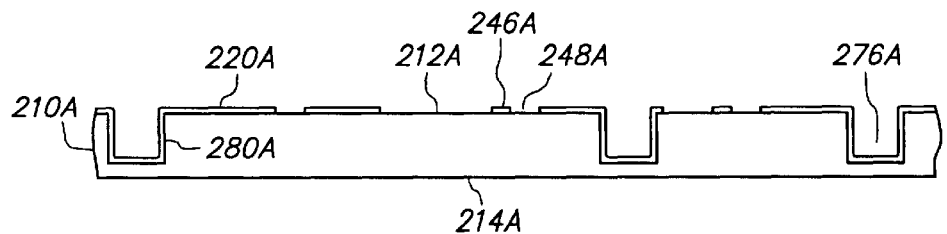
Figure 30A:
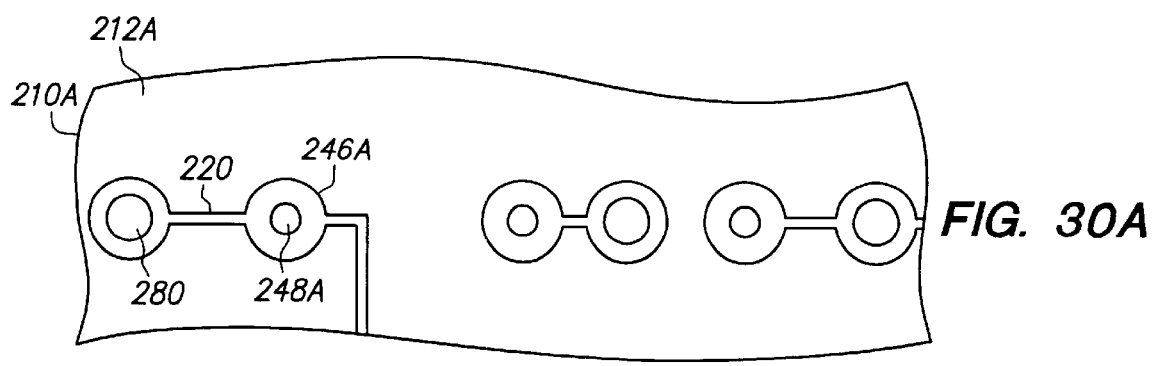
FIGS. 30A and 30B are top and bottom views, respectively, of FIG. 30.
Figure 30B:
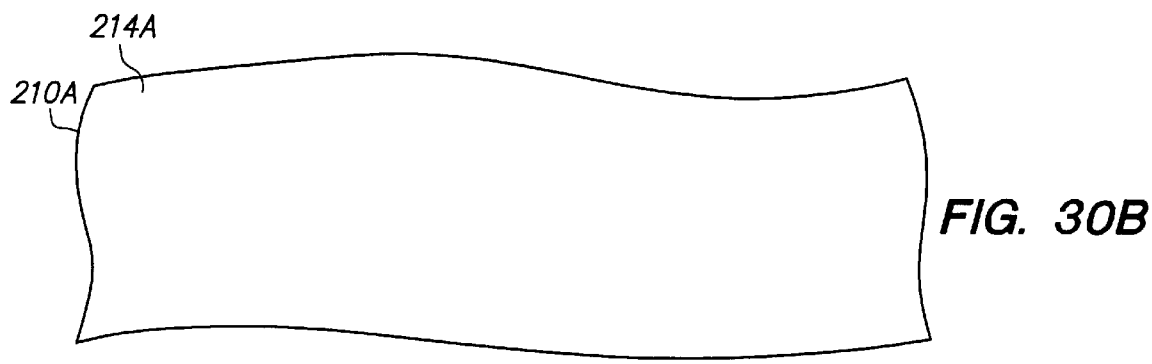

FIGS. 30, 30A and 30B are cross-sectional, top and bottom views, respectively, of metal layer 210A, routing lines 220A and pillars 280A. Metal layer 210A includes opposing major surfaces 212A and 214A, routing lines 220A are electroplated on surface 212A, and pillars 280A are electroplated in recesses 276A. Metal layer 210A, routing lines 220A and pillars 280A are manufactured in the same manner as metal layer 210, routing lines 220 and pillars 280, respectively. However, routing lines 220A include enlarged circular portions 246A and through-holes 248A within the enlarged circular portions 246A. Through-holes 248A have diameters of 150 microns.

Figure 31:
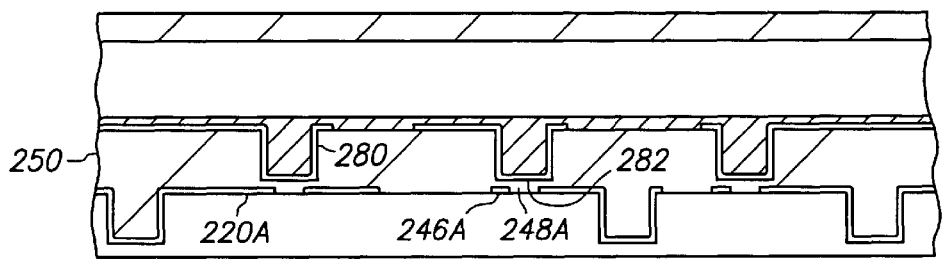

FIG. 31 is a cross-sectional view of routing lines 220A and pillars 280 attached together by dielectric layer 250. Dielectric layer 250 is a BCB layer with a thickness (between routing lines 220A and pillars 280) of 10 microns.

Routing lines 220A overlap pillars 280 in one-to-one relation. Thus, each enlarged circular portion 246A is axially aligned with and overlaps an associated pillar 280, and each through-hole 248A is axially aligned with and concentrically centered within a distal end 282 of an associated pillar 280. In addition, routing lines 220A and pillars 280 do not contact one another, and instead are separated by dielectric layer 250 and remain electrically isolated from one another.

Figure 32:
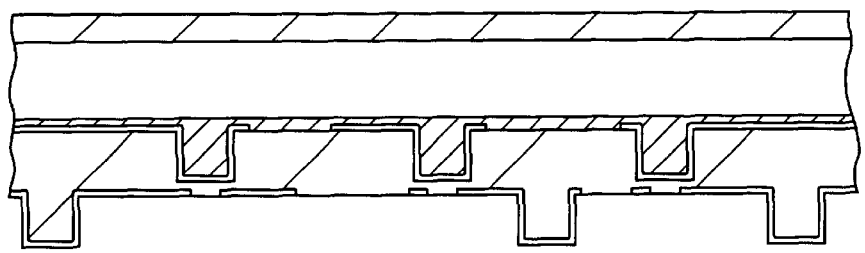

FIG. 32 is a cross-sectional view of the structure after metal layer 210A is removed in the same manner that metal layer 210 was removed.

Figure 33:
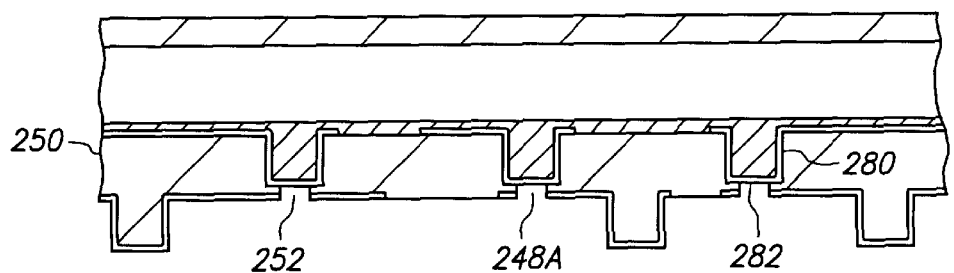

FIG. 33 is a cross-sectional view of the structure after openings 252 are formed in dielectric layer 250 by plasma etching. Openings 252 expose through-holes 248A and distal ends 282 of pillars 280.

Figure 34:
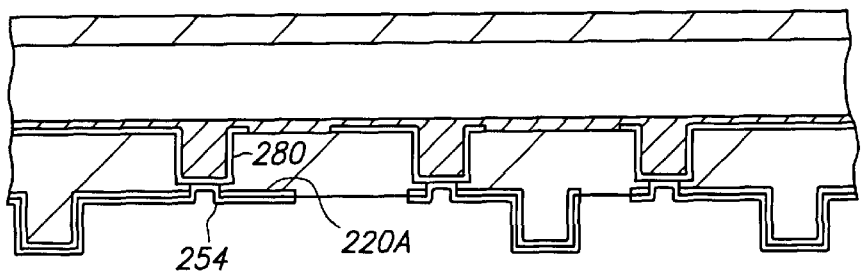

FIG. 34 is a cross-sectional view of the structure after connection joints 254 are formed on routing lines 220A and pillars 280, thereby electrically connecting routing lines 220A and pillars 280. Connection joints 254 are formed in the same manner as connection joints 154, except that the copper activator solution and subsequent deactivator solution are unnecessary since pillars 280 are composed of gold.

Figure 35:
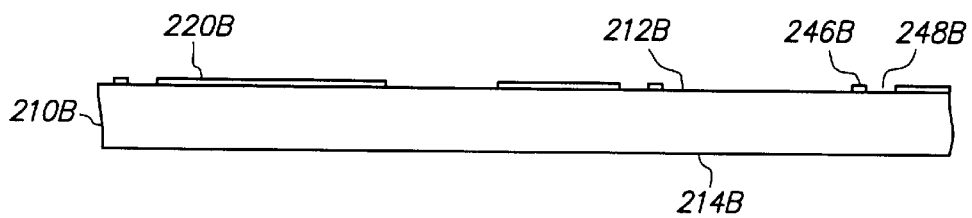

FIG. 35 is a cross-sectional view of metal layer 210B and routing lines 220B. Metal layer 210B includes opposing major surfaces 212B and 214B, and routing lines 220B include enlarged circular portions 246B and through-holes 248B and are electroplated on surface 212B.

Figure 36:
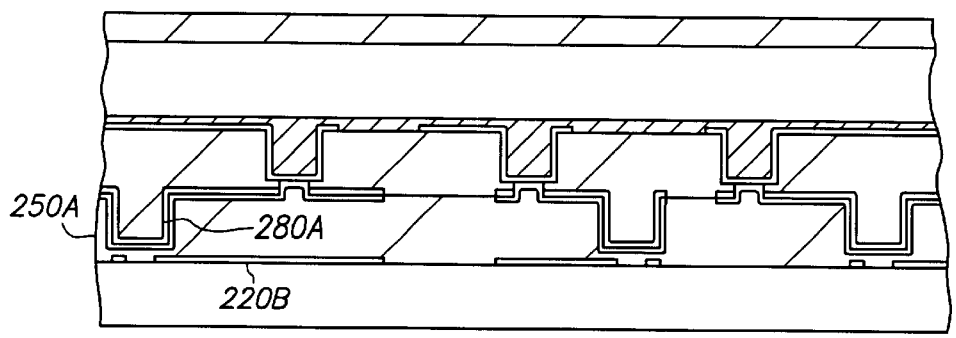

FIG. 36 is a cross-sectional view of routing lines 220B and pillars 280A attached together by dielectric layer 250A in the same manner that routing lines 220A and pillars 280 were attached together by dielectric layer 250.

Figure 37:
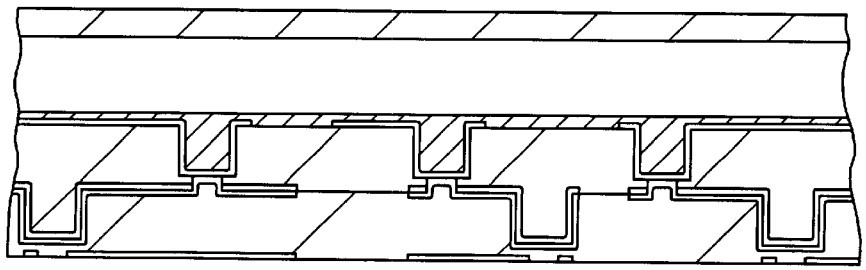

FIG. 37 is a cross-sectional view of the structure after metal layer 210B is removed.

Figure 38:
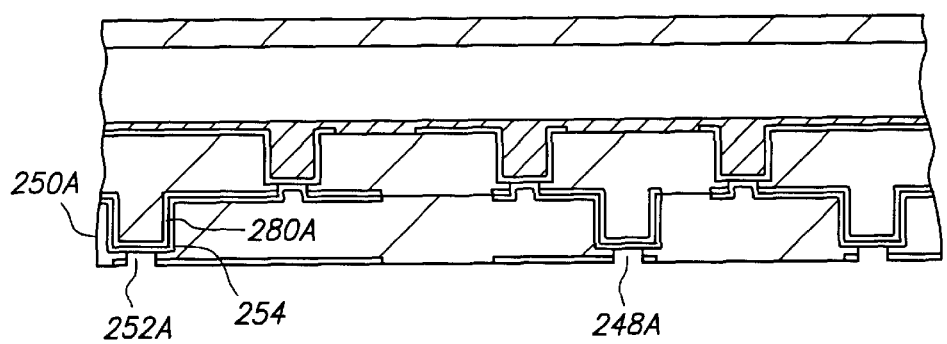

FIG. 38 is a cross-sectional view of the structure after openings 252A are formed in dielectric layer 250A that expose through-holes 248B and portions of connection joints 254 on distal ends 282A of pillars 280A.

Figure 39:
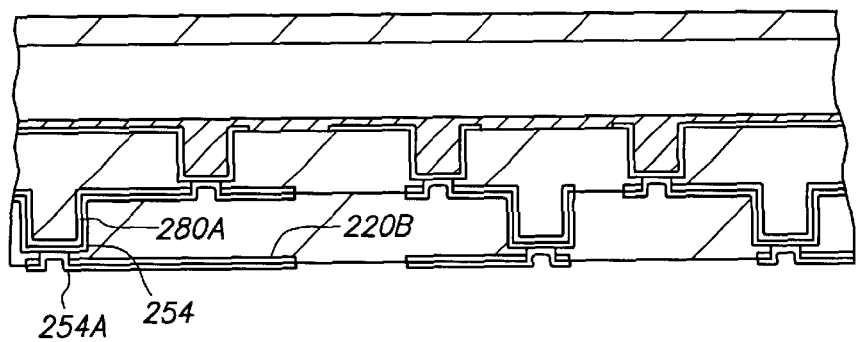

FIG. 39 is a cross-sectional view of the structure after connection joints 254A are formed on routing lines 220B and portions of connection joints 254 on pillars 280A, thereby electrically connecting routing lines 220B and pillars 280A.

Figure 40:
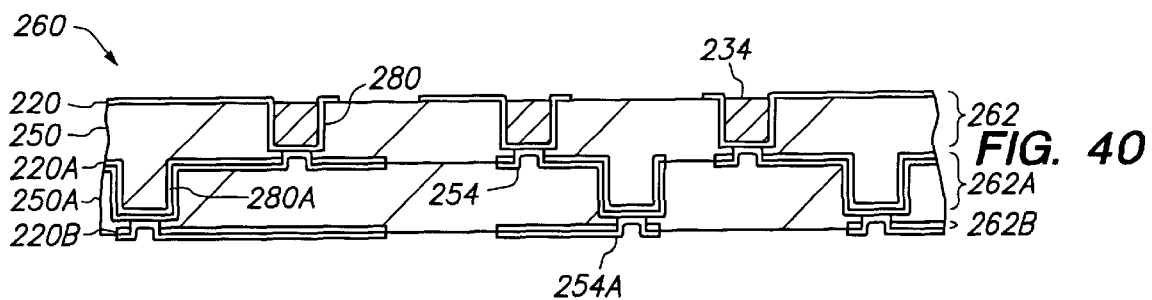

FIG. 40 is a cross-sectional view of the structure after etch mask 232, metal layer 230, and portions of adhesive 234 outside cavities 284 are removed in sequence.

At this stage, the manufacture of muitilayer interconnect substrate 260 that includes routing lines 220, 220A and 220B, pillars 280 and 280A, dielectric layers 250 and 250A and connection joints 254 and 254A can be considered complete. Routing lines 220 and pillars 280 provide a first interconnect layer 262, routing lines 220A and pillars 280A provide a second interconnect layer 262A, and routing lines 220B provide a third interconnect layer 262B.

The multilayer interconnect substrates described above are merely exemplary. Numerous other embodiments are contemplated.

The multilayer interconnect substrate can include two, three or more interconnect layers.

The interconnect layers can be manufactured in similar or different manners. For instance, the first interconnect layer can have routing lines tailored to accommodate electrical connections with semiconductor chip packages. In one approach, the first interconnect layer can have routing lines composed of a 0.5 micron layer of gold electroplated on a 4.5 micron layer of nickel to accommodate solder joints with semiconductor chip packages that tend to absorb gold, and the remaining interconnect layers can have routing lines composed of a 5 micron layer of gold. As another example, the final interconnect layer can include pillars for attachment to the next level assembly. In one approach, the final interconnect layer can include the bumped pillars of the second embodiment with dielectric filled cavities for vertical compliance with the next level assembly, and the preceding interconnect layers can include the conical pillars of the first embodiment with cavity-free tapered columns for enhanced strength.

The conductive traces can have various shapes and sizes and can be various conductive metals including copper, gold, nickel, aluminum, tin, combinations thereof, and alloys thereof. Of common metallic materials, copper has especially low resistivity and cost. Furthermore, those skilled in the art will understand that in the context of an electrical interconnect, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The routing lines (and/or pillars) can be formed on the metal layers by numerous deposition techniques including electroplating and electroless plating and can be deposited as a single layer or multiple layers. For instance, the routing lines can be a 5 micron layer of gold, or alternatively, a 4.5 micron layer of nickel electroplated on a 0.5 micron layer of gold electroplated on a copper plate to reduce costs, or alternatively, a 4 micron layer of nickel electroplated on a 0.5 micron layer of gold electroplated on a 0.5 micron layer of tin electroplated on a copper plate to reduce costs and avoid gold-copper alloys that may be difficult to remove when the copper plate is etched. If desired, the routing lines can be spot plated to make them compatible with the connection joints. For instance, a copper routing line can be spot plated with nickel and then silver to make it compatible with a gold ball bond connection joint and avoid the formation of brittle silver-copper intermetallic compounds. As another example, the routing lines can consist of a non-copper layer electroplated on a copper plate and a copper layer electroplated on the non-copper layer. Suitable non-copper layers include nickel, gold, palladium and silver. After the interconnect layers are attached by a dielectric layer, a wet chemical etch can be applied that is highly selective of copper with respect to the non-copper layer to selectively or completely remove the copper plate without removing the copper or non-copper layers. The non-copper layer provides an etch stop that prevents the wet chemical etch from removing the copper layer.

Figure 41:
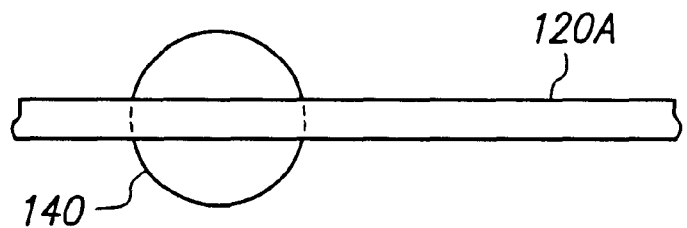
FIGS. 41–44 are enlarged plan views of routing line variations in accordance with the present invention.
Figure 42:
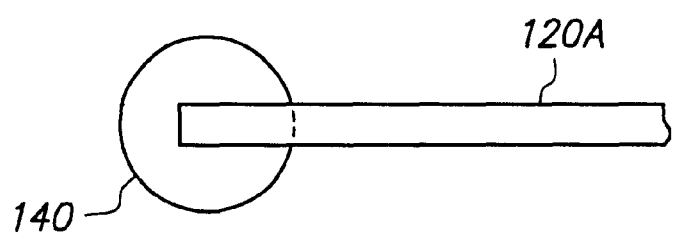
Figure 43:
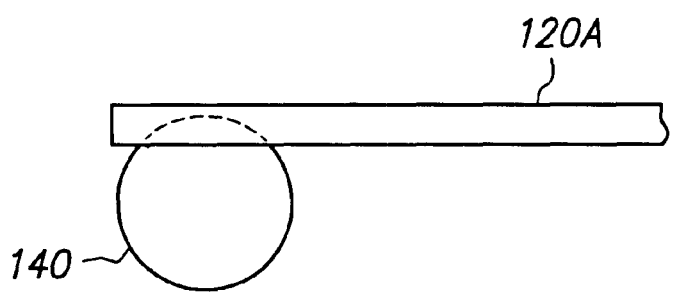
Figure 44:
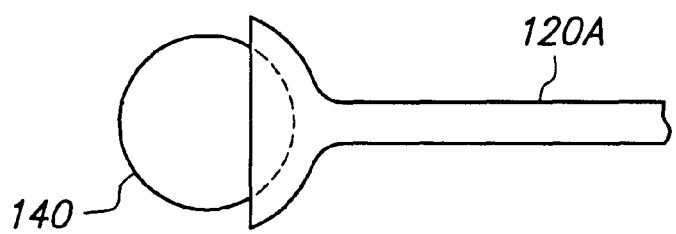

The routing lines need not include through-holes. For instance, the routing lines and the associated pillars can be positioned relative to one another so that the routing lines are aligned with and overlap the pillars, an etch can be applied that forms the openings in the dielectric layer that expose peripheral sidewalls of the routing lines and distal ends of the pillars that were previously covered by the dielectric layer while portions of the dielectric layer sandwiched between the routing lines and the distal ends of the pillars remain intact, and the connection joints can then be formed in the openings and contact the sides of the routing lines opposite the distal ends of the pillars, the peripheral sidewalls of the routing lines and the distal ends of the pillars. Thus, a routing line can overlap various portions of the distal end of an associated pillar, such as two spaced edge portions and the center of the distal end (FIG. 41), one continuous edge portion and the center of the distal end (FIG. 42), one continuous edge portion but not the center of the distal end (FIGS. 43 and 44), or the entire edge but not the center of the distal end (FIG. 9A).

The pillars can have a circular, ovular, square, rectangular or other shape (as viewed from the top or bottom surface of the structure). Furthermore, the pillar sidewalls may have a wide variety of shapes and slopes including vertical sidewalls, tapered sidewalls, continuous sidewalls and stepped sidewalls.

The metal layers can be various metals including copper, copper alloys, iron-nickel alloys, aluminum, and so on.

The dielectric layers may be rigid or flexible, and may be formed from numerous organic or inorganic insulators such as benzocyclobutene, polyquinoline, cyclic olefin, polyimide and epoxy. Organic insulators are preferred for low cost, high dielectric applications, whereas inorganic insulators are preferred when high thermal dissipation and a matched thermal coefficient of expansion are important. Similarly, the dielectric layers can be applied as a paste or liquid applied by screen-printing, spin-on, spray-on and other dispensing techniques.

The openings in the dielectric layers may be formed either before or after mechanically attaching the associated metal layers. For instance, a dielectric layer can be applied as a paste (A stage) to a metal layer, the dielectric layer can be partially cured (B stage), an etch can form the openings in the dielectric layer that expose distal ends of the pillars, the partially cured dielectric layer can be brought into contact with the other metal layer, and then the dielectric layer can be fully cured (C stage). Alternatively, the liquid or paste dielectric layer can be sandwiched between the metal layers, the dielectric layer can be fully cured thereby mechanically fastening the metal layers, one of the metal layers can be etched to expose the dielectric layer, and then an etch can form the openings in the dielectric layer.

The openings in the dielectric layers can be formed in numerous manners. For instance, the openings can be formed by laser ablation (including laser direct write without a mask and projection laser ablation with a mask) or plasma etching (including brief blanket plasma etching without a mask or plasma etching with a mask). The openings can also be formed by photodefinition if a photosensitive dielectric is used.

The adhesive that attaches the support carrier to the first interconnect layer need not be removed. For instance, the adhesive can remain intact after the support carrier is removed to protect the first interconnect layer, and if semiconductor chip packages are directly connected to the first interconnect layer, then openings can be formed in the adhesive to selectively expose the first interconnect layer, for example by applying a plasma etch through a mask.

The connection joints can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joints depends on design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

The "top" and "bottom" surfaces of the multilayer electrical interconnect do not depend on the orientation of the structure, as will be readily apparent to those skilled in the art. Likewise, the structure is shown with the pillars below the routing lines in a given interconnect layer, and the final interconnect layer below the first interconnect layer, with a single orientation throughout the drawings for ease of comparison between the figures, although the structure may be inverted at various manufacturing stages. For instance, the first interconnect layer can be inverted when the first dielectric layer is dispensed as a liquid resin on the first interconnect layer so that gravity assists with the dispensing process.

Advantageously, the multilayer electrical interconnect is reliable and inexpensive. The mode of the connection between the interconnect layers shifts from the initial mechanical coupling to metallurgical coupling to assure sufficient metallurgical bond strength. The tapered pillars yield enhanced reliability. In addition, plated through-holes and mechanically drilled holes are completely unnecessary. As a result, the multilayer electrical interconnect significantly enhances throughput, yield and performance characteristics compared to conventional electrical interconnects. The multilayer electrical interconnect is well-suited for use with materials compatible with copper chip and lead-free environmental requirements. Moreover, the multilayer electrical interconnect can be used in a wide variety of high density interconnect applications including smart cards, integrated circuit cards, memory modules, application specific modules, and so on.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a multilayer interconnect substrate, comprising:

providing a first interconnect layer that includes a first conductive trace, wherein the first conductive trace includes a first pillar and a first routing line, and the first pillar protrudes vertically from and is electrically connected to the first routing line;

providing a second interconnect layer that includes a second conductive trace, wherein the second conductive trace includes a second pillar and a second routing line, and the second pillar protrudes vertically from and is electrically connected to the second routing line;

forming an opening in a dielectric layer between the first and second interconnect layers that exposes portions of the first pillar and the second routing line that were previously covered by the dielectric layer; and forming a connection joint in the opening that contacts and electrically connects the first pillar and the second routing line.

2. The method of claim 1, wherein forming the opening includes applying a plasma to the dielectric layer.

3. The method of claim 1, wherein forming the connection joint includes plating a metal on the first pillar and the second routing line.

4. The method of claim 1, wherein the dielectric layer is a single-piece layer that contacts the first pillar, the first routing line and the second routing line.

5. The method of claim 1, wherein the first pillar and the first routing line are electroplated to one another, and the second pillar and the second routing line are electroplated to one another.

6. The method of claim 1, wherein the first pillar and the first routing line are integral with one another, and the second pillar and the second routing line are integral with one another.

7. The method of claim 1, wherein the first routing line is planar and provides horizontal routing for the first pillar, and the second routing line is planar and provides horizontal routing for the second pillar.

8. The method of claim 1, wherein the first pillar overlaps the second routing line and does not overlap the second pillar.

9. The method of claim 1, wherein the multilayer interconnect substrate is devoid of active circuitry and is not electrically connected to active circuitry.

10. The method of claim 1, wherein the multilayer interconnect substrate is adapted to receive a semiconductor chip package.

11. A method of manufacturing a multilayer interconnect substrate, comprising:

providing a first interconnect layer that includes a first conductive trace, wherein the first conductive trace includes a first pillar and a first routing line, and the first pillar protrudes vertically from and is electrically connected to the first routing line;

providing a second interconnect layer that includes a second conductive trace, wherein the second conductive trace includes a second pillar and a second routing line, and the second pillar protrudes vertically from and is electrically connected to the second routing line;

forming an opening in a dielectric layer between the first and second interconnect layers that exposes a distal portion of the first pillar and a sidewall portion the second routing line that overlap one another and were previously contacted and covered by the dielectric layer, wherein the dielectric layer contacts the first pillar, the first routing line and the second routing line, the opening does not expose the first routing line, and the opening does not expose the second pillar; and forming a connection joint in the opening that contacts and electrically connects the distal portion of the first pillar and the sidewall portion of the second routing line.

12. The method of claim 11, wherein the distal portion of the first pillar is a planar surface that faces away from the first routing line and towards the second routing line.

13. The method of claim 11, wherein the sidewall portion of the second routing line is at an inner sidewall of a through-hole in the second routing line.

14. The method of claim 11, wherein the sidewall portion of the second routing line is at a peripheral sidewall of the second routing line.

15. The method of claim 11, wherein the first pillar and the first routing line are electroplated to one another, and the second pillar and the second routing line are electroplated to one another.

16. The method of claim 11, wherein the first pillar and the first routing line are integral with one another, and the second pillar and the second routing line are integral with one another.

17. The method of claim 11, wherein the first routing line is planar and provides horizontal routing for the first pillar, and the second routing line is planar and provides horizontal routing for the second pillar.

18. The method of claim 11, wherein the first pillar does not overlap the second pillar.

19. The method of claim 11, wherein the multilayer interconnect substrate is devoid of active circuitry and is not electrically connected to active circuitry.

20. The method of claim 11, wherein the multilayer interconnect substrate is adapted to receive a semiconductor chip package.

21. A method of manufacturing a multilayer interconnect substrate, comprising the following steps in the sequence set forth:

providing a first metal layer with first and second opposing surfaces;

forming a first routing line on the first surface of the first metal layer and a first etch mask on the second surface of the first metal layer;

etching the first metal layer, thereby forming a first pillar from an unetched portion of the first metal layer that contacts the first etch mask and the first routing line and exposing a portion of the first routing line that was previously covered by the first metal layer;

removing the first etch mask;

disposing a dielectric layer between the first pillar and a second carrier, thereby mechanically attaching the first pillar and the second carrier, wherein the second carrier includes a second metal layer with first and second opposing surfaces, a second routing line on the first surface of the second metal layer, and a second etch mask on the second surface of the second metal layer;

etching the second metal layer, thereby forming a second pillar from an unetched portion of the second metal layer that contacts the second etch mask and the second routing line and exposing a portion of the second routing line that was previously covered by the second metal layer;

forming an opening in the dielectric layer that exposes portions of the first pillar and the second routing line that were previously covered by the dielectric layer; and forming a connection joint in the opening that contacts and electrically connects the first pillar and the second routing line.

22. The method of claim 21, wherein forming the first routing line includes electroplating the first routing line on the first metal layer, and forming the second routing line includes electroplating the second routing line on the second metal layer.

23. The method of claim 21, wherein forming the first etch mask includes electroplating the first etch mask on the first metal layer, and forming the second etch mask includes electroplating the second etch mask on the second metal layer.

24. The method of claim 21, wherein etching the first metal layer includes applying a wet chemical etch to the first metal layer and the first etch mask that is highly selective of the first metal layer with respect to the first etch mask and the first routing line, and etching the second metal layer includes applying a wet chemical etch to the second metal layer and the second etch mask that is highly selective of the second metal layer with respect to the second etch mask and the second routing line.

25. The method of claim 21, wherein disposing the dielectric layer includes contacting the dielectric layer to the first pillar, the first routing line and the second routing line and then curing the dielectric layer.

26. The method of claim 21, wherein forming the opening includes applying a plasma to the dielectric layer.

27. The method of claim 21, wherein forming the connection joint includes plating a metal on the first pillar and the second routing line.

28. The method of claim 21, wherein the first pillar overlaps the second routing line.

29. The method of claim 21, wherein the multilayer interconnect substrate is devoid of active circuitry and is not electrically connected to active circuitry.

30. The method of claim 21, wherein the multilayer interconnect substrate is adapted to receive a semiconductor chip package.

31. A method of manufacturing a multilayer interconnect substrate, comprising:

providing a first metal layer with first and second opposing surfaces;

forming a first routing line on the first surface of the first metal layer;

forming a first etch mask on the second surface of the first metal layer;

attaching a support carrier to a side of the first routing line that faces away from the first metal layer;

etching the first metal layer, thereby forming a first pillar from an unetched portion of the first metal layer that contacts the first etch mask and the first routing line and exposing a portion of the first routing line that was previously covered by the first metal layer;

removing the first etch mask;

providing a second metal layer with first and second opposing surfaces;

forming a second routing line on the first surface of the second metal layer;

forming a second etch mask on the second surface of the second metal layer;

disposing a first dielectric layer between the first pillar and the second routing line, thereby mechanically attaching the first pillar and the second routing line;

etching the second metal layer, thereby forming a second pillar from an unetched portion of the second metal layer that contacts the second etch mask and the second routing line and exposing a portion of the second routing line that was previously covered by the second metal layer;

removing the second etch mask;

forming an opening in the first dielectric layer that exposes portions of the first pillar and the second routing line that were previously covered by the first dielectric layer, wherein the opening does not expose the first routing line and does not expose the second pillar;

forming a connection joint in the opening that contacts and electrically connects the first pillar and the second routing line;

forming a second dielectric layer that contacts the first dielectric layer and covers the second pillar and the second routing line; and removing the support carrier.

32. The method of claim 31, wherein forming the first routing line includes electroplating the first routing line on the first metal layer, and forming the second routing line includes electroplating the second routing line on the second metal layer.

33. The method of claim 31, wherein forming the first etch mask includes electroplating the first etch mask on the first metal layer, and forming the second etch mask includes electroplating the second etch mask on the second metal layer.

34. The method of claim 31, wherein etching the first metal layer includes applying a wet chemical etch to the first metal layer and the first etch mask that is highly selective of the first metal layer with respect to the first etch mask and the first routing line, and etching the second metal layer includes applying a wet chemical etch to the second metal layer and the second etch mask that is highly selective of the second metal layer with respect to the second etch mask and the second routing line.

35. The method of claim 31, wherein disposing the first dielectric layer includes contacting the first dielectric layer to the first pillar, the first routing line and the second routing line and then curing the first dielectric layer.

36. The method of claim 31, wherein forming the opening includes applying a plasma to the first dielectric layer.

37. The method of claim 31, wherein forming the connection joint includes plating a metal on the first pillar and the second routing line.

38. The method of claim 31, including forming an opening in the second dielectric layer, and forming a connection joint in the opening in the second dielectric layer that electrically connects the second pillar and a third routing line.

39. The method of claim 31, wherein the multilayer interconnect substrate is devoid of active circuitry and is not electrically connected to active circuitry.

40. The method of claim 31, wherein the multilayer interconnect substrate is adapted to receive a semiconductor chip package.

41. A method of manufacturing a multilayer interconnect substrate, comprising the following steps in the sequence set forth:

providing a first metal layer with first and second opposing surfaces;

forming a first recess in the first surface of the first metal layer;

forming a first routing line on the first surface of the first metal layer and a first pillar in the first recess of the first metal layer;

etching the first metal layer, thereby exposing portions of the first pillar and the first routing line that were previously covered by the first metal layer;

disposing a dielectric layer between the first pillar and a second carrier, thereby mechanically attaching the first pillar and the second carrier, wherein the second carrier includes a second metal layer with first and second opposing surfaces, a second recess in the first surface of the second metal layer, a second routing line on the first surface of the second metal layer, and a second pillar in the second recess of the second metal layer;

etching the second metal layer, thereby exposing portions of the second pillar and the second routing line that were previously covered by the second metal layer;

forming an opening in the dielectric layer that exposes portions of the first pillar and the second routing line that were previously covered by the dielectric layer; and forming a connection joint in the opening that contacts and electrically connects the first pillar and the second routing line.

42. The method of claim 41, wherein forming the first pillar and the first routing line includes electroplating the first pillar and the first routing line on the first metal layer, and forming the second pillar and the second routing line includes electroplating the second pillar and the second routing line on the second metal layer.

43. The method of claim 41, wherein the first pillar and the first routing line are integral with one another, and the second pillar and the second routing line are integral with one another.

44. The method of claim 41, wherein etching the first metal layer includes applying a wet chemical etch to the first metal layer that is highly selective of the first metal layer with respect to the first pillar and the first routing line, and etching the second metal layer includes applying a wet chemical etch to the second metal layer that is highly selective of the second metal layer with respect to the second pillar and the second routing line.

45. The method of claim 41, wherein disposing the dielectric layer includes contacting the dielectric layer to the first pillar, the first routing line and the second routing line and then curing the dielectric layer.

46. The method of claim 41, wherein forming the opening includes applying a plasma to the dielectric layer.

47. The method of claim 41, wherein forming the connection joint includes plating a metal on the first pillar and the second routing line.

48. The method of claim 41, wherein the first pillar overlaps the second routing line.

49. The method of claim 41, wherein the multilayer interconnect substrate is devoid of active circuitry and is not electrically connected to active circuitry.

50. The method of claim 41, wherein the multilayer interconnect substrate is adapted to receive a semiconductor chip package.

51. A method of manufacturing a multilayer interconnect substrate, comprising:

providing a first metal layer with first and second opposing surfaces;

forming a first recess in the first surface of the first metal layer;

forming a first routing line on the first surface of the first metal layer and a first pillar in the first recess of the first metal layer;

attaching a support carrier to a side of the first routing line that faces away from the first metal layer;

etching the first metal layer, thereby exposing portions of the first pillar and the first routing line that were previously covered by the first metal layer;

providing a second metal layer with first and second opposing surfaces;

forming a second recess in the first surface of the second metal layer;

forming a second routing line on the first surface of the second metal layer and a second pillar in the second recess of the second metal layer;

disposing a first dielectric layer between the first pillar and the second routing line, thereby mechanically attaching the first pillar and the second routing line;

etching the second metal layer, thereby exposing portions of the second pillar and the second routing line that were previously covered by the second metal layer;

forming an opening in the first dielectric layer that exposes portions of the first pillar and the second routing line that were previously covered by the first dielectric layer, wherein the opening does not expose the first routing line and does not expose the second pillar;

forming a connection joint in the opening that contacts and electrically connects the first pillar and the second routing line;

forming a second dielectric layer that contacts the first dielectric layer and covers the second pillar and the second routing line; and removing the support carrier.

52. The method of claim 51, wherein forming the first pillar and the first routing line includes electroplating the first pillar and the first routing line on the first metal layer, and forming the second pillar and the second routing line includes electroplating the second pillar and the second routing line on the second metal layer.

53. The method of claim 51, wherein the first pillar and the first routing line are integral with one another, and the second pillar and the second routing line are integral with one another.

54. The method of claim 51, wherein etching the first metal layer includes applying a wet chemical etch to the first metal layer that is highly selective of the first metal layer with respect to the first pillar and the first routing line, and etching the second metal layer includes applying a wet chemical etch to the second metal layer that is highly selective of the second metal layer with respect to the second pillar and the second routing line.

55. The method of claim 51, wherein disposing the first dielectric layer includes contacting the first dielectric layer to the first pillar, the first routing line and the second routing line and then curing the first dielectric layer.

56. The method of claim 51, wherein forming the opening includes applying a plasma to the first dielectric layer.

57. The method of claim 51, wherein forming the connection joint includes plating a metal on the first pillar and the second routing line.

58. The method of claim 51, including forming an opening in the second dielectric layer, and forming a connection joint in the opening in the second dielectric layer that electrically connects the second pillar and a third routing line.

59. The method of claim 51, wherein the multilayer interconnect substrate is devoid of active circuitry and is not electrically connected to active circuitry.

60. The method of claim 51, wherein the multilayer interconnect substrate is adapted to receive a semiconductor chip package.

61. A method of manufacturing a multilayer interconnect substrate, comprising the following steps in the sequence set forth:

providing a first metal layer with first and second opposing surfaces;

forming a first routing line on the first surface of the first metal layer and a first etch mask on the second surface of the first metal layer;

etching the first metal layer, thereby forming a first pillar from an unetched portion of the first metal layer that contacts the first etch mask and the first routing line and exposing a portion of the first routing line that was previously covered by the first metal layer;

disposing a dielectric layer between the first pillar and a second carrier, thereby mechanically attaching the first pillar and the second carrier, wherein the second carrier includes a second metal layer with first and second opposing surfaces, and a second routing line on the first surface of the second metal layer;

etching the second metal layer, thereby forming a second pillar from an unetched portion of the second metal layer that contacts a second etch mask and the second routing line and exposing a portion of the second routing line that was previously covered by the second metal layer;

forming an opening in the dielectric layer that is aligned with the first pillar; and forming a connection joint in the opening that electrically connects the first pillar and the second routing line.

62. The method of claim 61, wherein forming the first routing line includes electroplating the first routing line on the first metal layer, and forming the second routing line includes electroplating the second routing line on the second metal layer.

63. The method of claim 61, wherein forming the first etch mask includes electroplating the first etch mask on the first metal layer, and forming the second etch mask includes electroplating the second etch mask on the second metal layer.

64. The method of claim 61, wherein etching the first metal layer includes applying a wet chemical etch to the first metal layer and the first etch mask that is highly selective of the first metal layer with respect to the first etch mask and the first routing line, and etching the second metal layer includes applying a wet chemical etch to the second metal layer and the second etch mask that is highly selective of the second metal layer with respect to the second etch mask and the second routing line.

65. The method of claim 61, wherein disposing the dielectric layer includes contacting the dielectric layer to the first pillar, the first routing line and the second routing line and then curing the dielectric layer.

66. The method of claim 61, wherein forming the opening includes applying a plasma to the dielectric layer.

67. The method of claim 61, wherein forming the connection joint includes plating a metal in the opening.

68. The method of claim 61, wherein the first pillar overlaps the second routing line.

69. The method of claim 61, wherein the multilayer interconnect substrate is devoid of active circuitry and is not electrically connected to active circuitry.

70. The method of claim 61, wherein the multilayer interconnect substrate is adapted to receive a semiconductor chip package.

71. A method of manufacturing a multilayer interconnect substrate, comprising:
   providing a first metal layer with first and second opposing surfaces;
   forming a first routing line on the first surface of the first metal layer;
   forming a first etch mask on the second surface of the first metal layer;
   attaching a support carrier to a side of the first routing line that faces away from the first metal layer;
   etching the first metal layer, thereby forming a first pillar from an unetched portion of the first metal layer that contacts the first etch mask and the first routing line and exposing a portion of the first routing line that was previously covered by the first metal layer;
   removing the first etch mask;
   providing a second metal layer with first and second opposing surfaces;
   forming a second routing line on the first surface of the second metal layer;
   forming a second etch mask on the second surface of the second metal layer;
   disposing a first dielectric layer between the first pillar and the second routing line, thereby mechanically attaching the first pillar and the second routing line;
   etching the second metal layer, thereby forming a second pillar from an unetched portion of the second metal layer that contacts the second etch mask and the second routing line and exposing a portion of the second routing line that was previously covered by the second metal layer;
   removing the second etch mask;
   forming an opening in the first dielectric layer that is aligned with the first pillar, wherein the opening is not aligned with the second pillar;
   forming a connection joint in the opening that electrically connects the first pillar and the second routing line;
   forming a second dielectric layer that contacts the first dielectric layer and covers the second pillar and the second routing line; and
   removing the support carrier.

72. The method of claim 71, wherein forming the first routing line includes electroplating the first routing line on the first metal layer, and forming the second routing line includes electroplating the second routing line on the second metal layer.

73. The method of claim 71, wherein forming the first etch mask includes electroplating the first etch mask on the first metal layer, and forming the second etch mask includes electroplating the second etch mask on the second metal layer.

74. The method of claim 71, wherein etching the first metal layer includes applying a wet chemical etch to the first metal layer and the first etch mask that is highly selective of the first metal layer with respect to the first etch mask and the first routing line, and etching the second metal layer includes applying a wet chemical etch to the second metal layer and the second etch mask that is highly selective of the second metal layer with respect to the second etch mask and the second routing line.

75. The method of claim 71, wherein disposing the first dielectric layer includes mechanically attaching the first pillar and the second routing line before forming the second pillar.

76. The method of claim 71, wherein forming the opening includes applying a plasma to the first dielectric layer.

77. The method of claim 71, wherein forming the connection joint includes plating a metal in the opening.

78. The method of claim 71, including forming an opening in the second dielectric layer that is aligned with the second pillar, and forming a connection joint in the opening in the second dielectric layer that electrically connects the second pillar and a third routing line.

79. The method of claim 71, wherein the multilayer interconnect substrate is devoid of active circuitry and is not electrically connected to active circuitry.

80. The method of claim 71, wherein the multilayer interconnect substrate is adapted to receive a semiconductor chip package.

81. A method of manufacturing a multilayer interconnect substrate, comprising the following steps in the sequence set forth:
   providing a first metal layer with first and second opposing surfaces;
   forming a first recess in the first surface of the first metal layer;
   forming a first routing line on the first surface of the first metal layer and a first pillar in the first recess of the first metal layer;
   etching the first metal layer, thereby exposing portions of the first pillar and the first routing line that were previously covered by the first metal layer;
   disposing a dielectric layer between the first pillar and a second carrier, thereby mechanically attaching the first pillar and the second carrier, wherein the second carrier includes a second metal layer with first and second opposing surfaces, a second recess in the first surface of the second metal layer, a second routing line on the first surface of the second metal layer, and a second pillar in the second recess of the second metal layer;
   etching the second metal layer, thereby exposing portions of the second pillar and the second routing line that were previously covered by the second metal layer;
   forming an opening in the dielectric layer that is aligned with the first pillar; and
   forming a connection joint in the opening that electrically connects the first pillar and the second routing line.

82. The method of claim 81, wherein forming the first pillar and the first routing line includes electroplating the first pillar and the first routing line on the first metal layer, and forming the second pillar and the second routing line includes electroplating the second pillar and the second routing line on the second metal layer.

83. The method of claim 81, wherein the first pillar and the first routing line are integral with one another, and the second pillar and the second routing line are integral with one another.

84. The method of claim 81, wherein etching the first metal layer includes applying a wet chemical etch to the first metal layer that is highly selective of the first metal layer with respect to the first pillar and the first routing line, and etching the second metal layer includes applying a wet chemical etch to the second metal layer that is highly selective of the second metal layer with respect to the second pillar and the second routing line.

85. The method of claim 81, wherein disposing the dielectric layer includes contacting the dielectric layer to the first pillar, the first routing line and the second routing line and then curing the dielectric layer.

86. The method of claim 81, wherein forming the opening includes applying a plasma to the dielectric layer.

87. The method of claim 81, wherein forming the connection joint includes plating a metal in the opening.

88. The method of claim 81, wherein the first pillar overlaps the second routing line.

89. The method of claim 81, wherein the multilayer interconnect substrate is devoid of active circuitry and is not electrically connected to active circuitry.

90. The method of claim 81, wherein the multilayer interconnect substrate is adapted to receive a semiconductor chip package.

91. A method of manufacturing a multilayer interconnect substrate, comprising:

providing a first metal layer with first and second opposing surfaces;

forming a first recess in the first surface of the first metal layer;

forming a first routing line on the first surface of the first metal layer and a first pillar in the first recess of the first metal layer;

attaching a support carrier to a side of the first routing line that faces away from the first metal layer;

etching the first metal layer, thereby exposing portions of the first pillar and the first routing line that were previously covered by the first metal layer;

providing a second metal layer with first and second opposing surfaces;

forming a second recess in the first surface of the second metal layer;

forming a second routing line on the first surface of the second metal layer and a second pillar in the second recess of the second metal layer;

disposing a first dielectric layer between the first pillar and the second routing line, thereby mechanically attaching the first pillar and the second routing line;

etching the second metal layer, thereby exposing portions of the second pillar and the second routing line that were previously covered by the second metal layer;

forming an opening in the first dielectric layer that is aligned with the first pillar, wherein the opening is not aligned with the second pillar;

forming a connection joint in the opening that electrically connects the first pillar and the second routing line;

forming a second dielectric layer that contacts the first dielectric layer and covers the second pillar and the second routing line; and removing the support carrier.

92. The method of claim 91, wherein forming the first pillar and the first routing line includes electroplating the first pillar and the first routing line on the first metal layer, and forming the second pillar and the second routing line includes electroplating the second pillar and the second routing line on the second metal layer.

93. The method of claim 91, wherein the first pillar and the first routing line are integral with one another, and the second pillar and the second routing line are integral with one another.

94. The method of claim 91, wherein etching the first metal layer includes applying a wet chemical etch to the first metal layer that is highly selective of the first metal layer with respect to the first pillar and the first routing line, and etching the second metal layer includes applying a wet chemical etch to the second metal layer that is highly selective of the second metal layer with respect to the second pillar and the second routing line.

95. The method of claim 91, wherein disposing the first dielectric layer includes mechanically attaching the first pillar and the second metal layer.

96. The method of claim 91, wherein forming the opening includes applying a plasma to the first dielectric layer.

97. The method of claim 91, wherein forming the connection joint includes plating a metal in the opening.

98. The method of claim 91, including forming an opening in the second dielectric layer that is aligned with the second pillar, and forming a connection joint in the opening in the second dielectric layer that electrically connects the second pillar and a third routing line.

99. The method of claim 91, wherein the multilayer interconnect substrate is devoid of active circuitry and is not electrically connected to active circuitry.

100. The method of claim 91, wherein the multilayer interconnect substrate is adapted to receive a semiconductor chip package.

* * * * *